(12) United States Patent
Sakairi

(10) Patent No.: US 11,088,355 B2
(45) Date of Patent: Aug. 10, 2021

(54) DISPLAY UNIT WITH PREVENTED CURRENT LEAKAGE, METHOD OF MANUFACTURING THE SAME, AND METHOD OF MANUFACTURING ELECTRONIC APPARATUS

(71) Applicant: SONY CORPORATION, Tokyo (JP)

(72) Inventor: Takashi Sakairi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/372,679

(22) Filed: Apr. 2, 2019

(65) Prior Publication Data

US 2019/0229300 A1 Jul. 25, 2019

Related U.S. Application Data

(62) Division of application No. 14/417,229, filed as application No. PCT/JP2013/004418 on Jul. 19, 2013, now abandoned.

(30) Foreign Application Priority Data

Aug. 2, 2012 (JP) .................................. 2012-172181

(51) Int. Cl.
*H01L 51/56* (2006.01)
*H01L 51/00* (2006.01)
(Continued)

(52) U.S. Cl.
CPC .......... *H01L 51/56* (2013.01); *H01L 27/3244* (2013.01); *H01L 27/3246* (2013.01); *H01L 51/0014* (2013.01); *H01L 51/0015* (2013.01);

*H01L 51/0023* (2013.01); *H01L 51/5012* (2013.01); *H01L 51/5088* (2013.01);
(Continued)

(58) Field of Classification Search
CPC ............................ H01L 51/56; H01L 27/3244
See application file for complete search history.

(56) References Cited

U.S. PATENT DOCUMENTS

2003/0189400 A1* 10/2003 Nishio .................. H01L 51/001
313/504
2004/0253756 A1 12/2004 Cok et al.
(Continued)

FOREIGN PATENT DOCUMENTS

DE 102006000322 A1 1/2007
EP 1489671 A2 12/2004
(Continued)

OTHER PUBLICATIONS

Final Rejection for U.S. Appl. No. 14/417,229, dated Dec. 13, 2018, 17 pages.
(Continued)

*Primary Examiner* — Thao X Le
*Assistant Examiner* — Xia L Cross
(74) *Attorney, Agent, or Firm* — Chip Law Group

(57) ABSTRACT

There is provided a method of manufacturing a display unit. The method includes forming a plurality of first electrodes, forming a functional layer that covers from the first electrode to an inter-electrode region, and locally applying an energy ray to the functional layer to form a disconnecting section or a high-resistance section in the functional layer in the inter-electrode region.

11 Claims, 30 Drawing Sheets

(51) Int. Cl.
  *H01L 51/50* (2006.01)
  *H01L 27/32* (2006.01)
  *H01L 51/52* (2006.01)

(52) U.S. Cl.
  CPC ...... *H01L 51/5206* (2013.01); *H01L 51/5221* (2013.01); *H01L 51/5253* (2013.01); *H01L 27/322* (2013.01); *H01L 51/005* (2013.01); *H01L 51/006* (2013.01); *H01L 51/0059* (2013.01); *H01L 51/0081* (2013.01); *H01L 2251/301* (2013.01); *H01L 2251/303* (2013.01)

(56) References Cited

U.S. PATENT DOCUMENTS

| | | |
|---|---|---|
| 2006/0024855 A1 | 2/2006 | Sano |
| 2007/0001588 A1 | 1/2007 | Boroson et al. |
| 2007/0019396 A1 | 1/2007 | Kaiba |
| 2007/0029554 A1 | 2/2007 | Nakamura et al. |
| 2007/0069235 A1* | 3/2007 | Ueno ............... H01J 63/06 257/109 |
| 2007/0080356 A1 | 4/2007 | Nakayama et al. |
| 2007/0172699 A1* | 7/2007 | Nakashima ......... H01L 51/0059 428/690 |
| 2009/0167516 A1 | 7/2009 | Kogawara et al. |
| 2009/0230845 A1 | 9/2009 | Kuma et al. |
| 2010/0148192 A1 | 6/2010 | Jung et al. |
| 2010/0309101 A1* | 12/2010 | Kanegae ............... H01L 51/529 345/76 |
| 2012/0217516 A1* | 8/2012 | Hatano ............... H01L 27/3246 257/88 |
| 2014/0167018 A1 | 6/2014 | Okumoto et al. |

FOREIGN PATENT DOCUMENTS

| | | |
|---|---|---|
| JP | 2002-110345 A | 4/2002 |
| JP | 2003-109492 A | 4/2003 |
| JP | 2007-246060 A | 9/2007 |
| JP | 2009-004347 A | 1/2009 |
| JP | 2009-157736 A | 7/2009 |
| JP | 2009-230956 A | 10/2009 |
| JP | 2010-000893 A | 1/2010 |
| KR | 10-2004-0111048 A | 12/2004 |
| WO | 2009/133680 A1 | 11/2009 |

OTHER PUBLICATIONS

Non-Final Rejection for U.S. Appl. No. 14/417,229, dated Jul. 18, 2018, 17 pages.
Advisory Action for U.S. Appl. No. 14/417,229, dated May 31, 2018, 03 pages.
Final Rejection for U.S. Appl. No. 14/417,229, dated Feb. 23, 2018, 14 pages.
Non-Final Rejection for U.S. Appl. No. 14/417,229, dated Sep. 8, 2017, 13 pages.
Advisory Action for U.S. Appl. No. 14/417,229, dated Aug. 9, 2017, 03 pages.
Final Rejection for U.S. Appl. No. 14/417,229, dated May 26, 2017, 14 pages.
Non-Final Rejection for U.S. Appl. No. 14/417,229, dated Feb. 8, 2017, 11 pages.
Advisory Action for U.S. Appl. No. 14/417,229, dated Dec. 13, 2016, 03 pages.
Final Rejection for U.S. Appl. No. 14/417,229, dated Sep. 19, 2016, 11 pages.
Non-Final Rejection for U.S. Appl. No. 14/417,229, dated Apr. 21, 2016, 12 pages.
International Search Report and Written Opinion of PCT Application No. PCT/JP2013/000418, dated May 7, 2013, 06 pages of English Translation and 06 pages of ISRWO.
International Preliminary Report on Patentability of PCT Application No. PCT/JP2013/000418, dated Aug. 21, 2014, 07 pages of English Translation and 05 pages of IPRP.
Office Action for KR Patent Application No. 10-2015-7001905, dated Sep. 14, 2020, 2 pages of Office Action and 2 pages of English Translation.
Office Action for KR Patent Application No. 10-2020-7035870, dated Feb. 3, 2021, 06 pages of Office Action and 05 pages Of English Translation.

* cited by examiner

[FIG. 1]
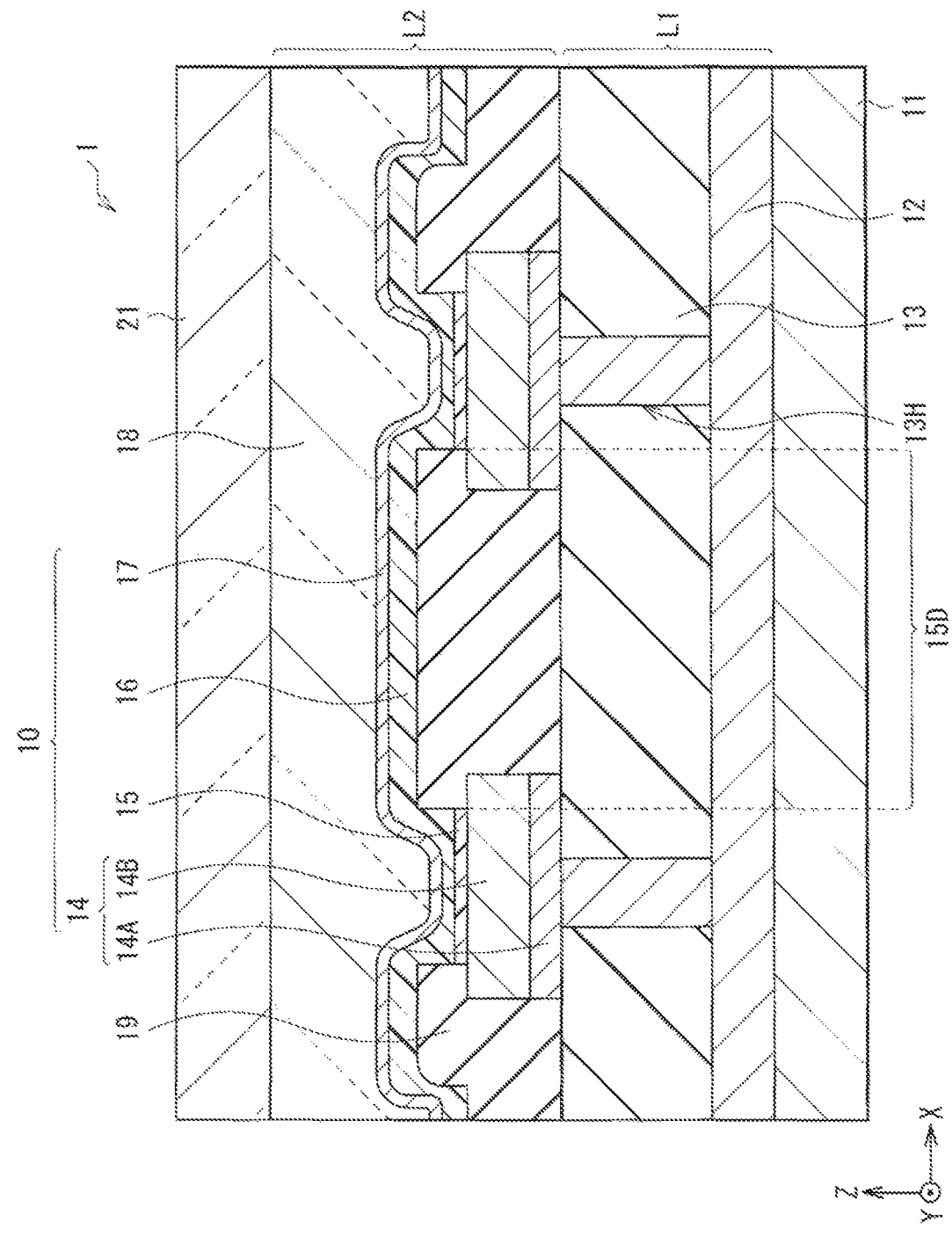

[FIG. 2]
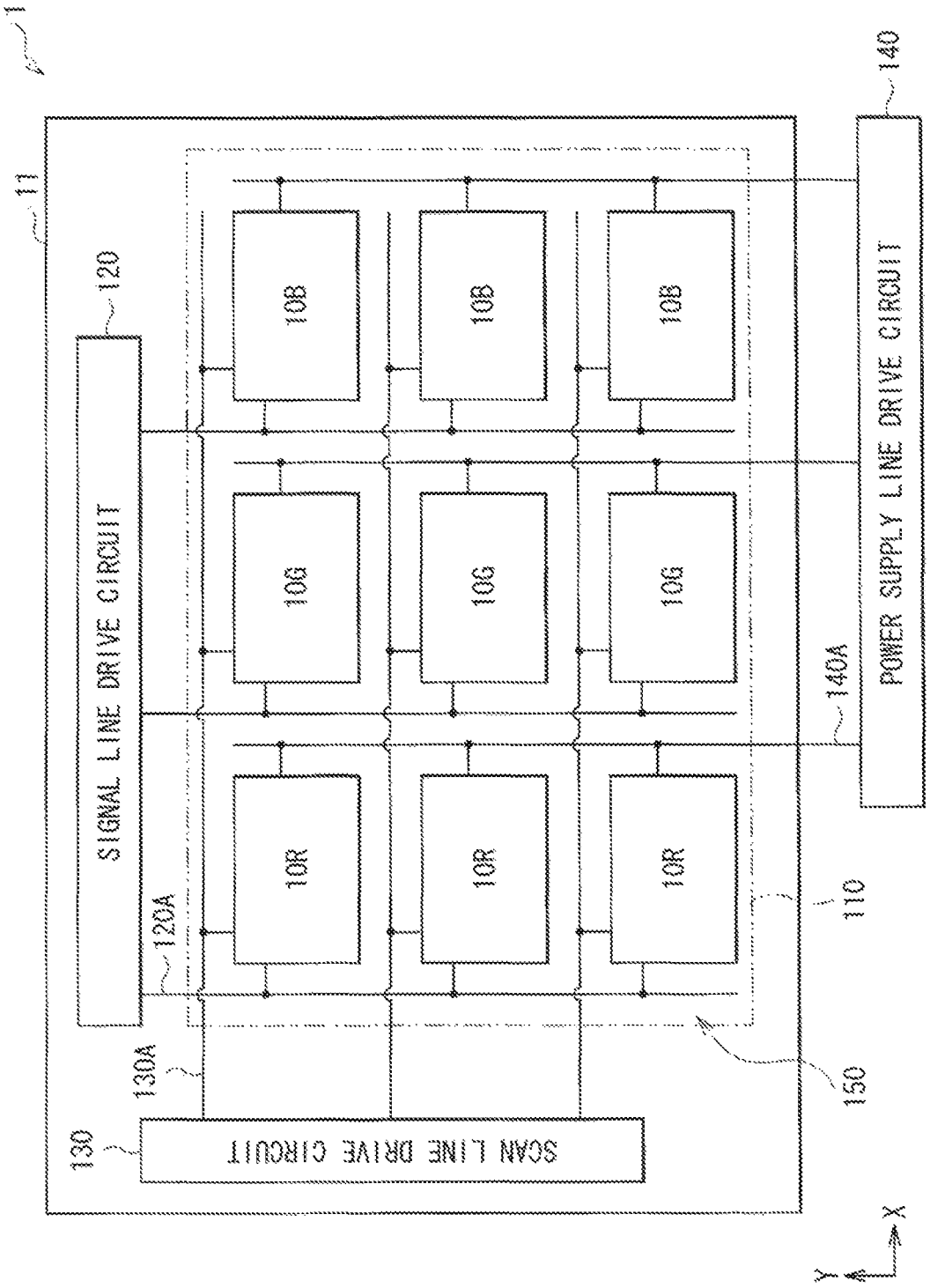

[FIG. 3]
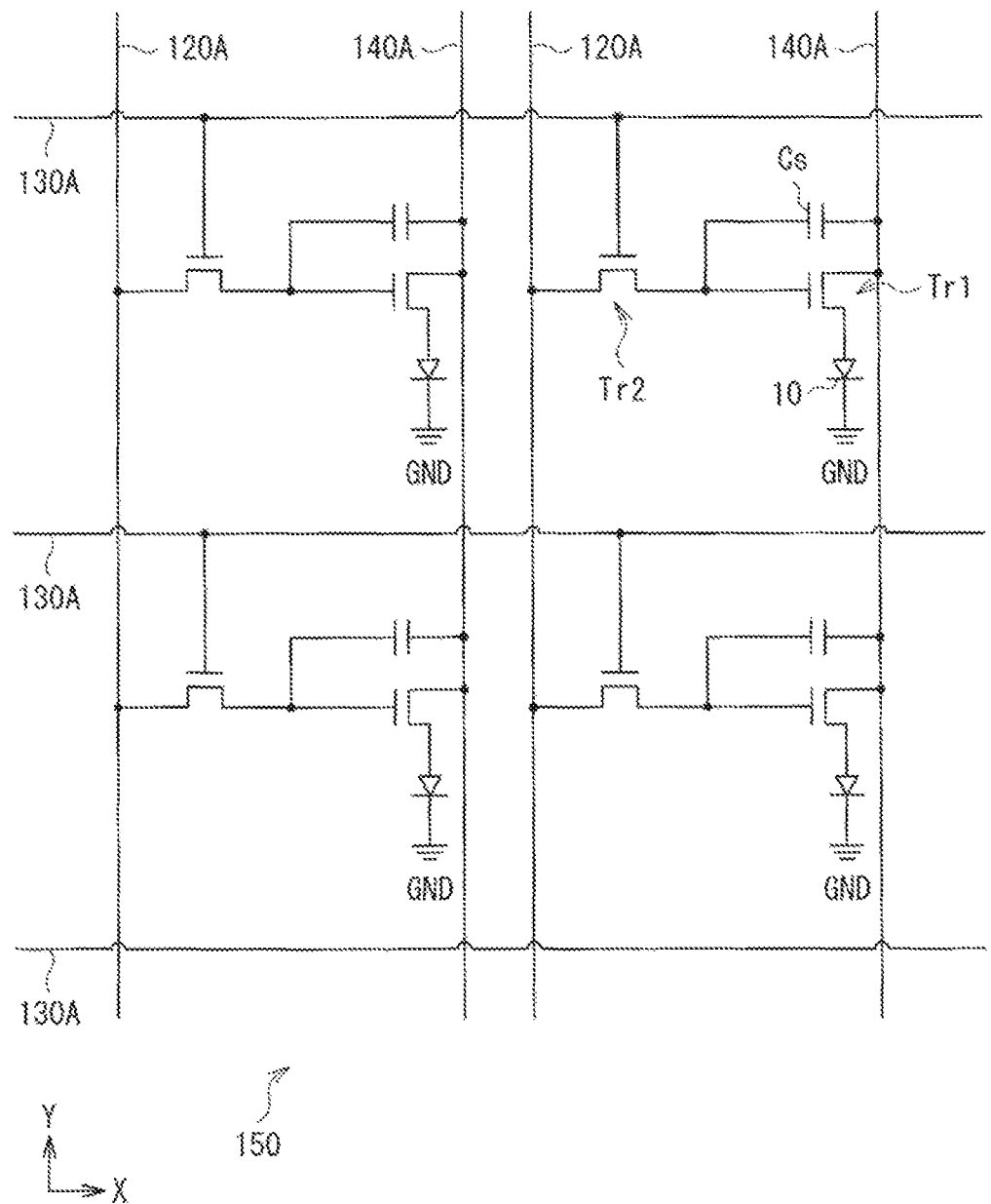

[FIG. 4]
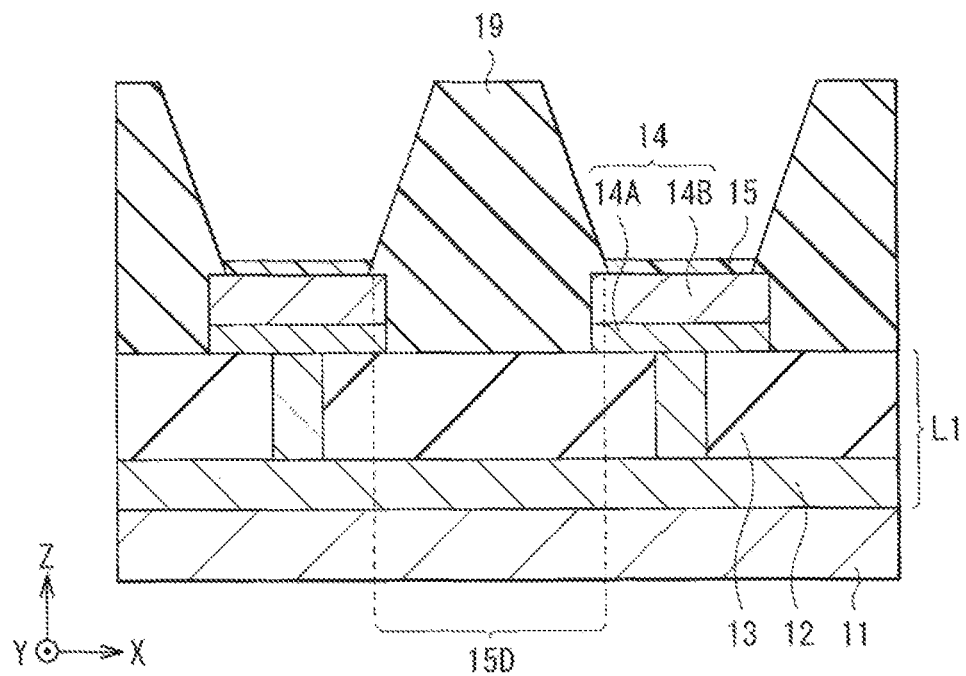
[FIG. 5A]
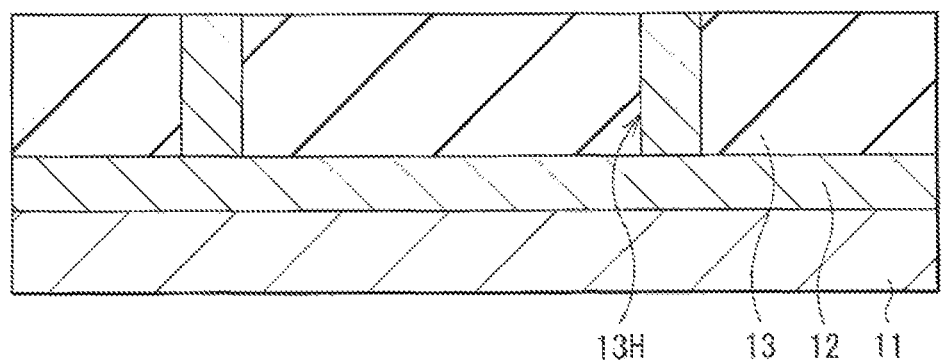

[FIG. 5B]
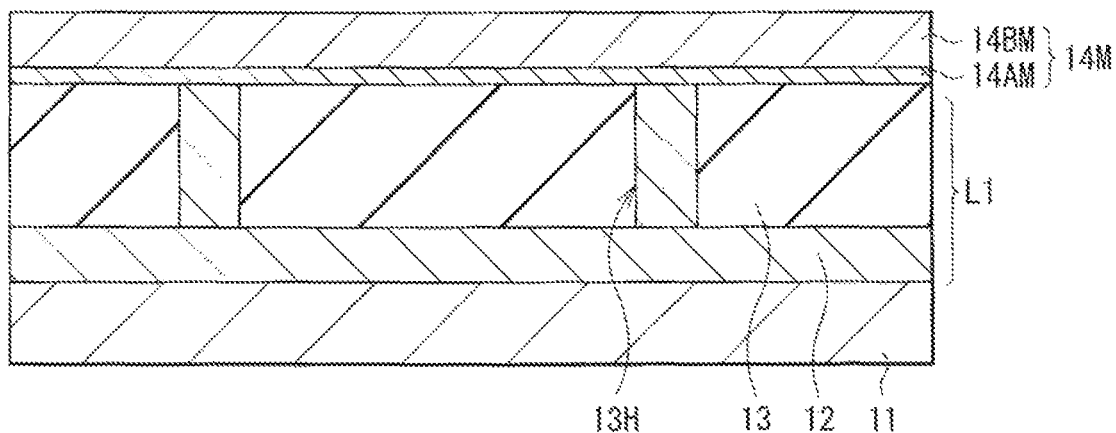
[FIG. 5C]
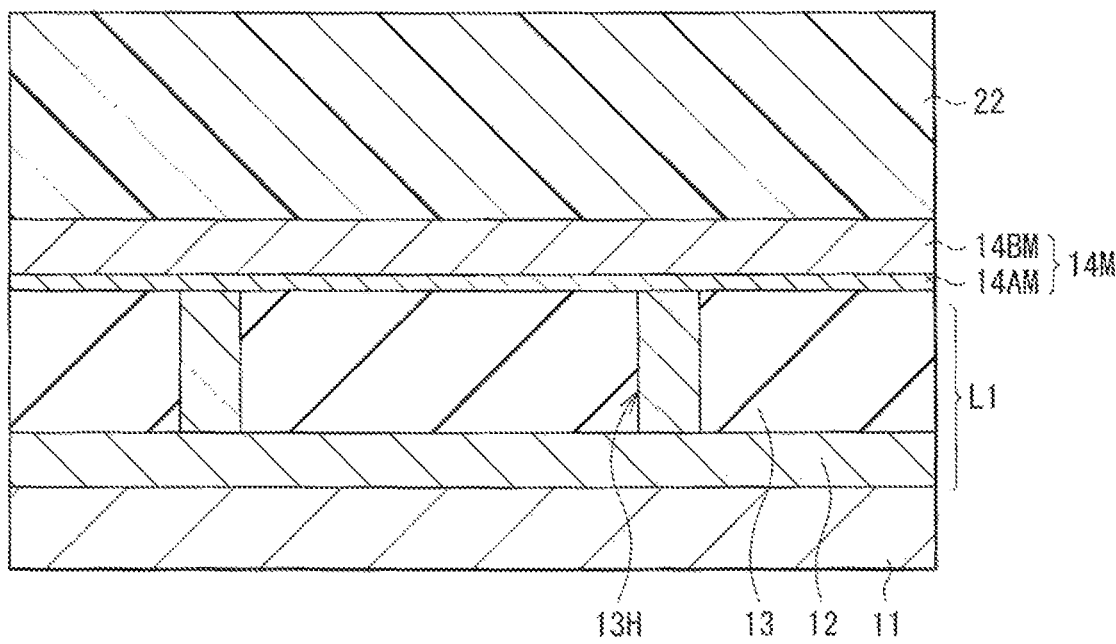

[FIG. 6A]
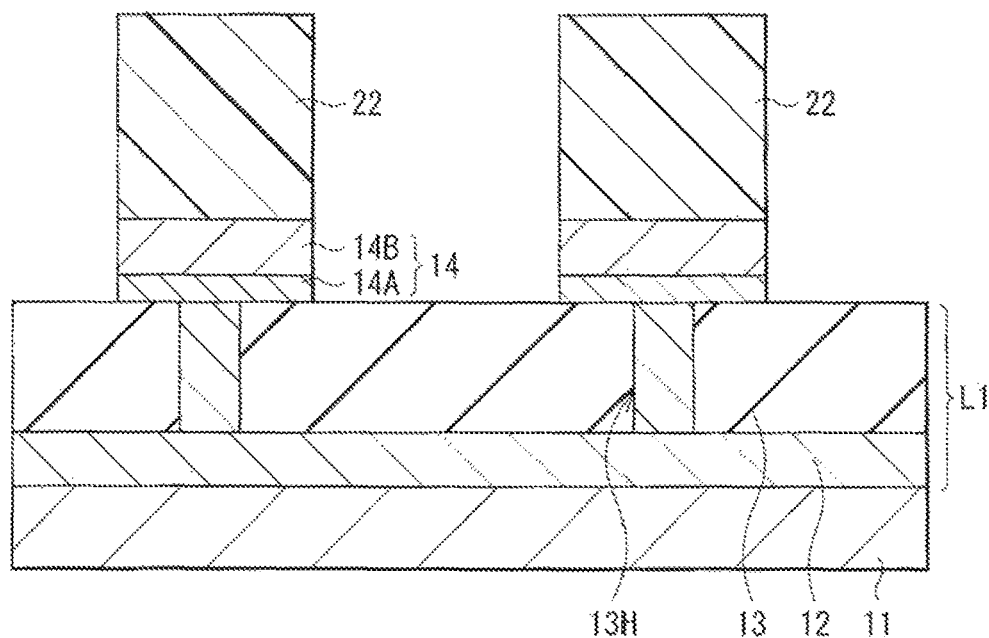
[FIG. 6B]
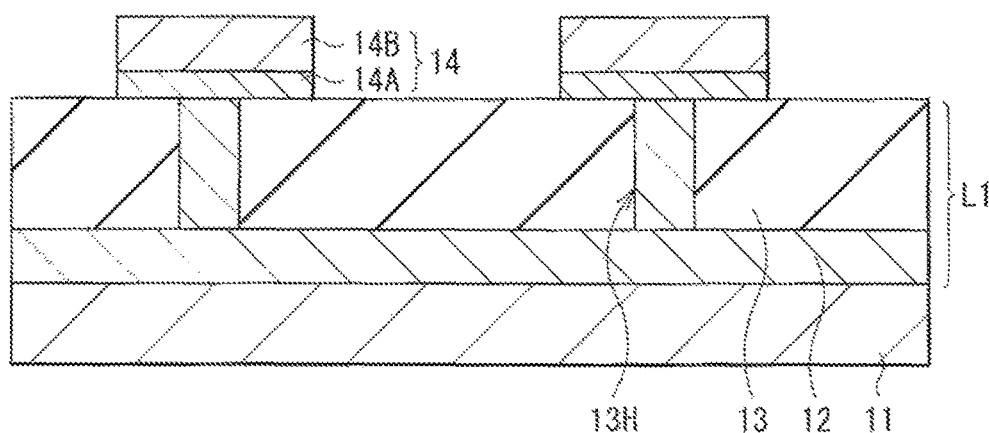
[FIG. 6C]
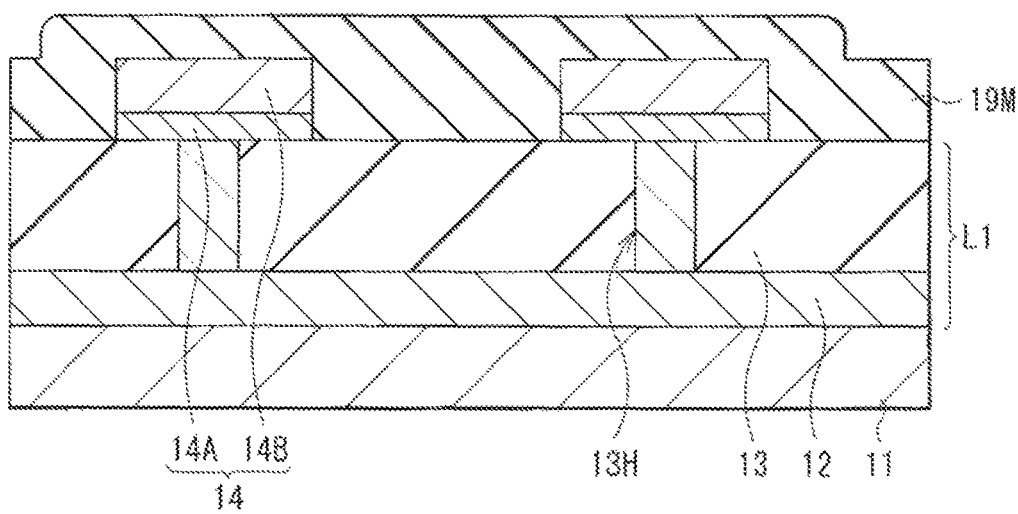

[FIG. 7A]
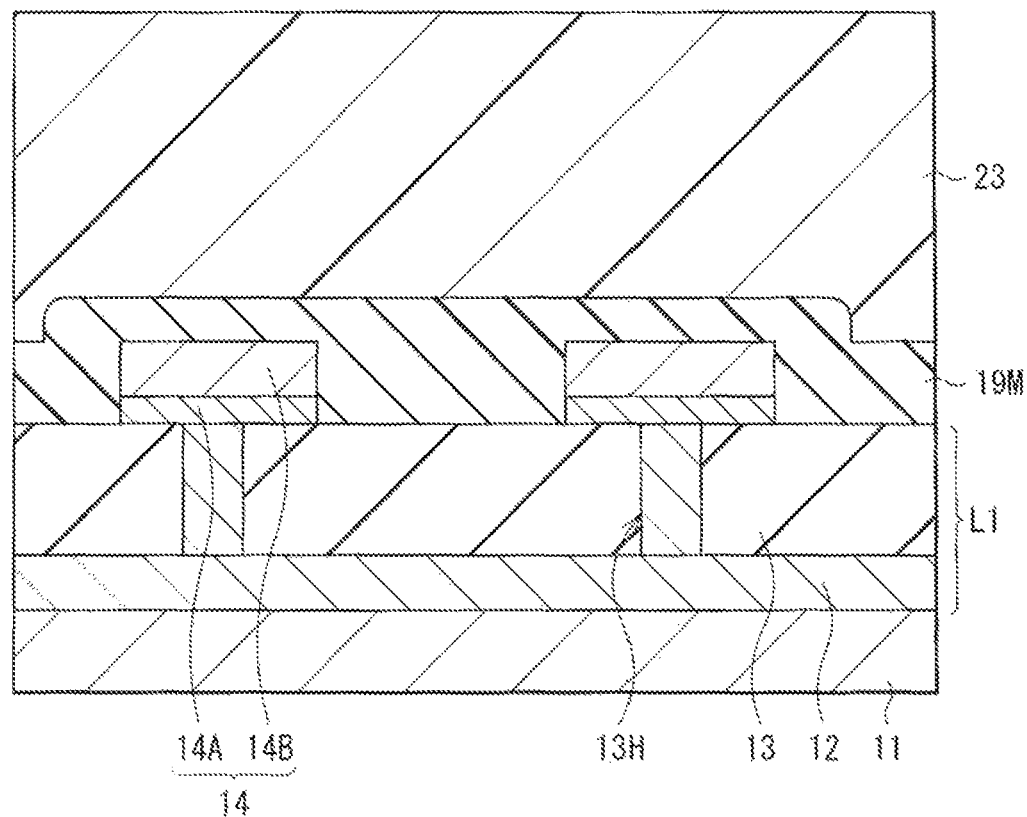
[FIG. 7B]
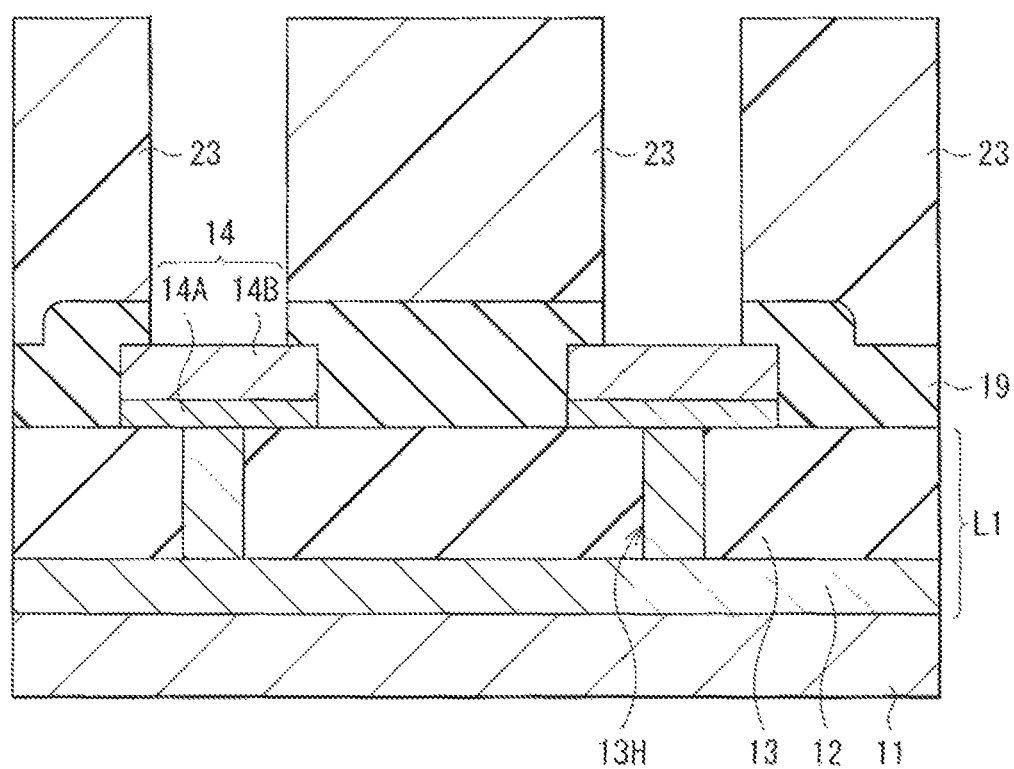

[FIG. 8A]
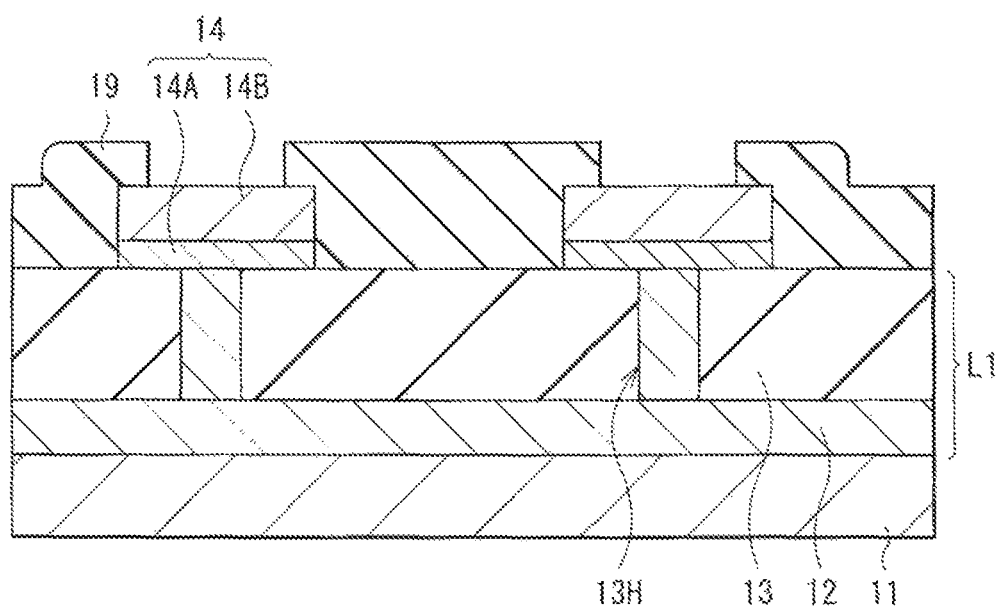
[FIG. 8B]
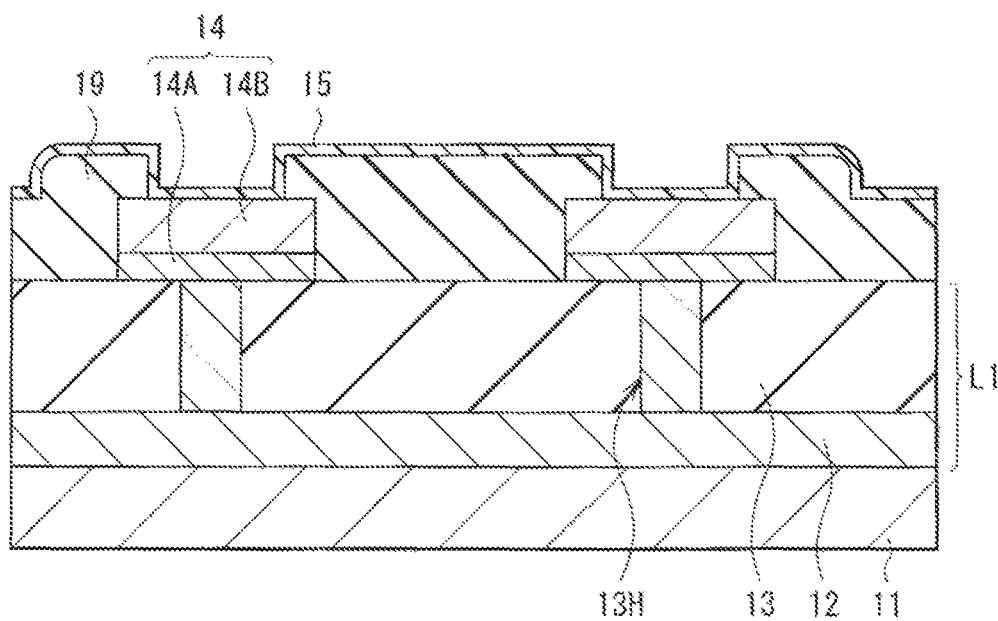

[FIG. 9A]
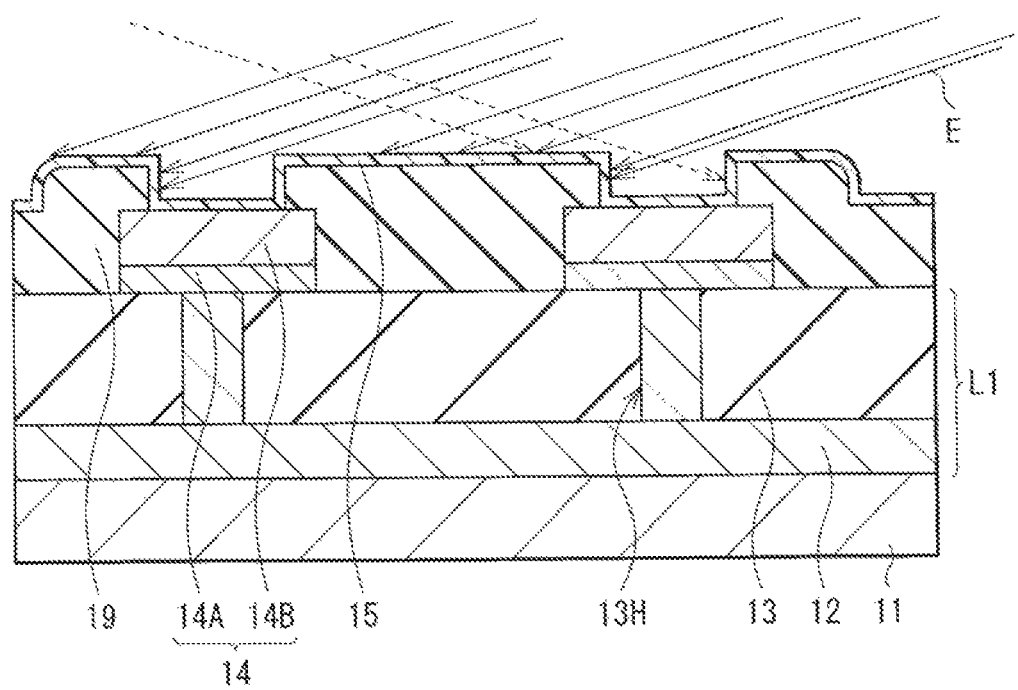
[FIG. 9B]
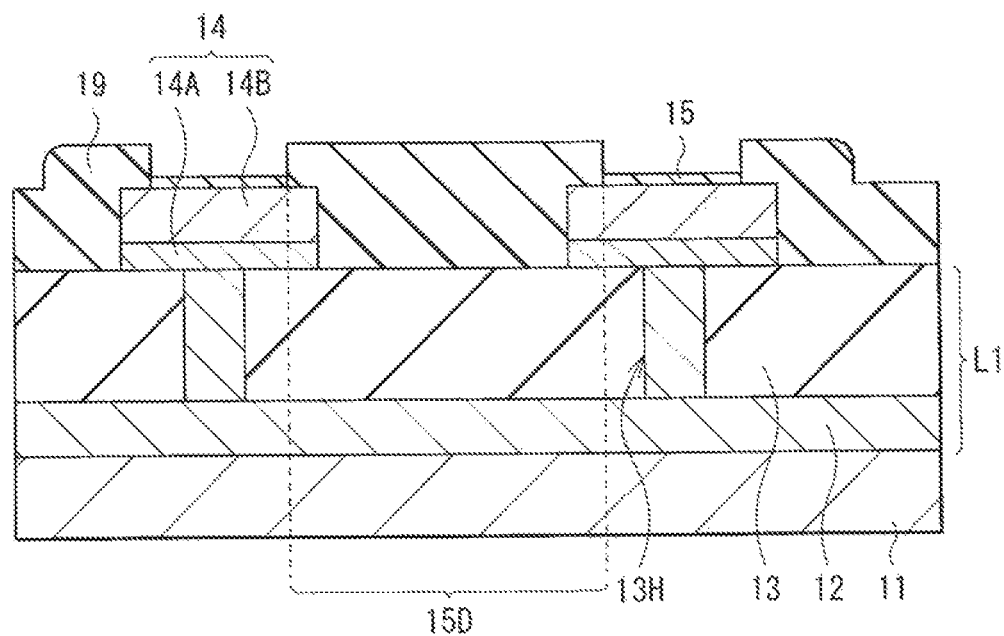

[FIG. 10]
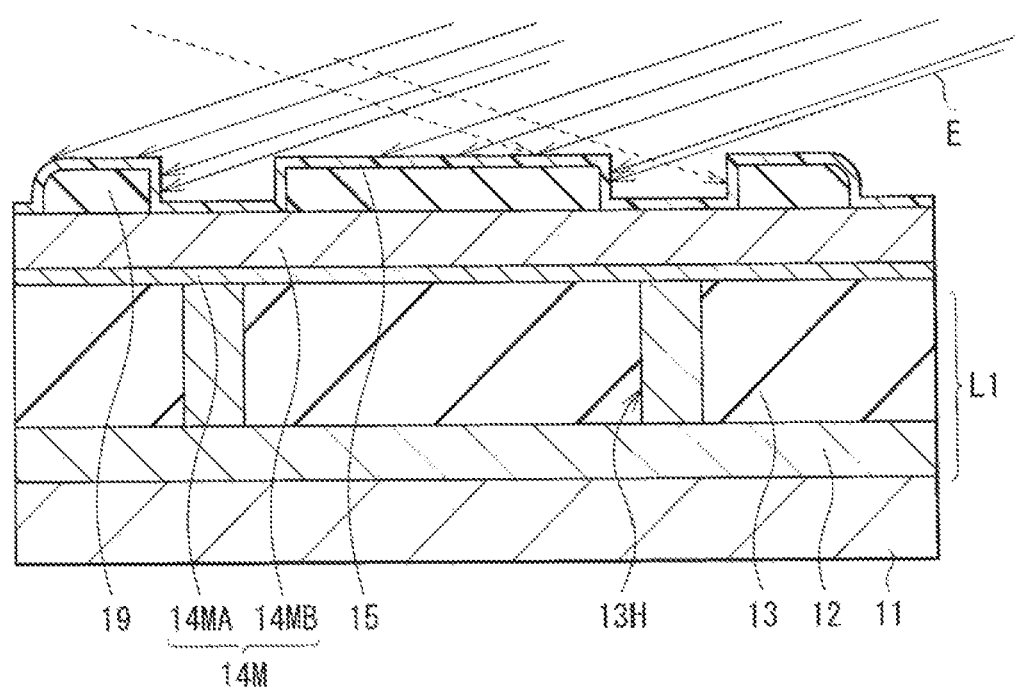

[FIG. 11A]
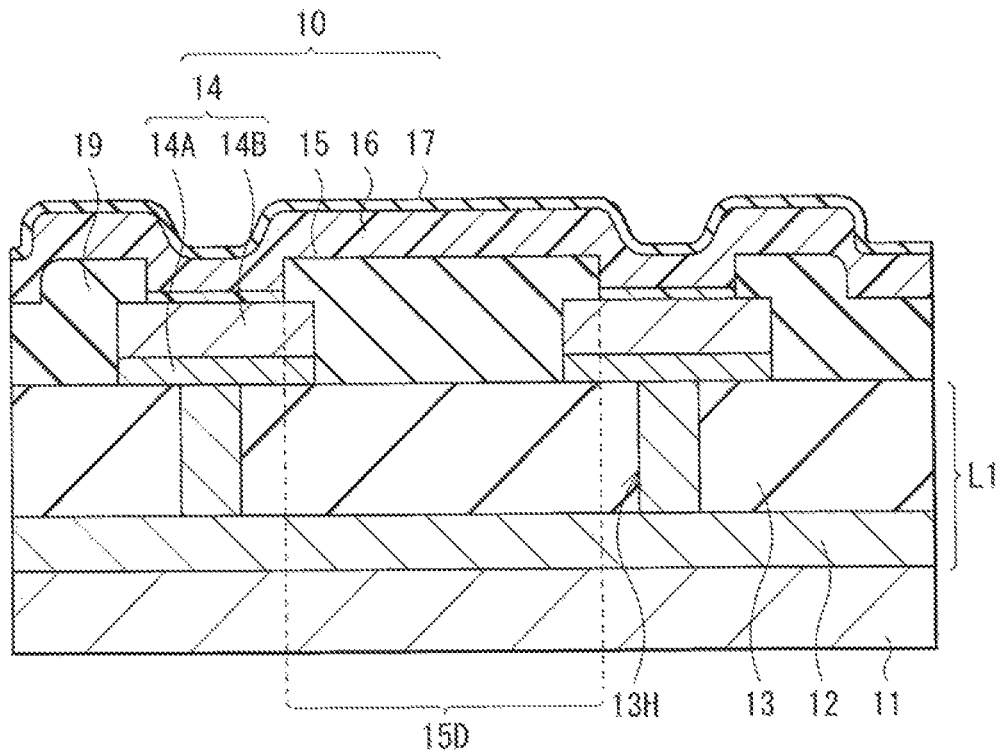
[FIG. 11B]
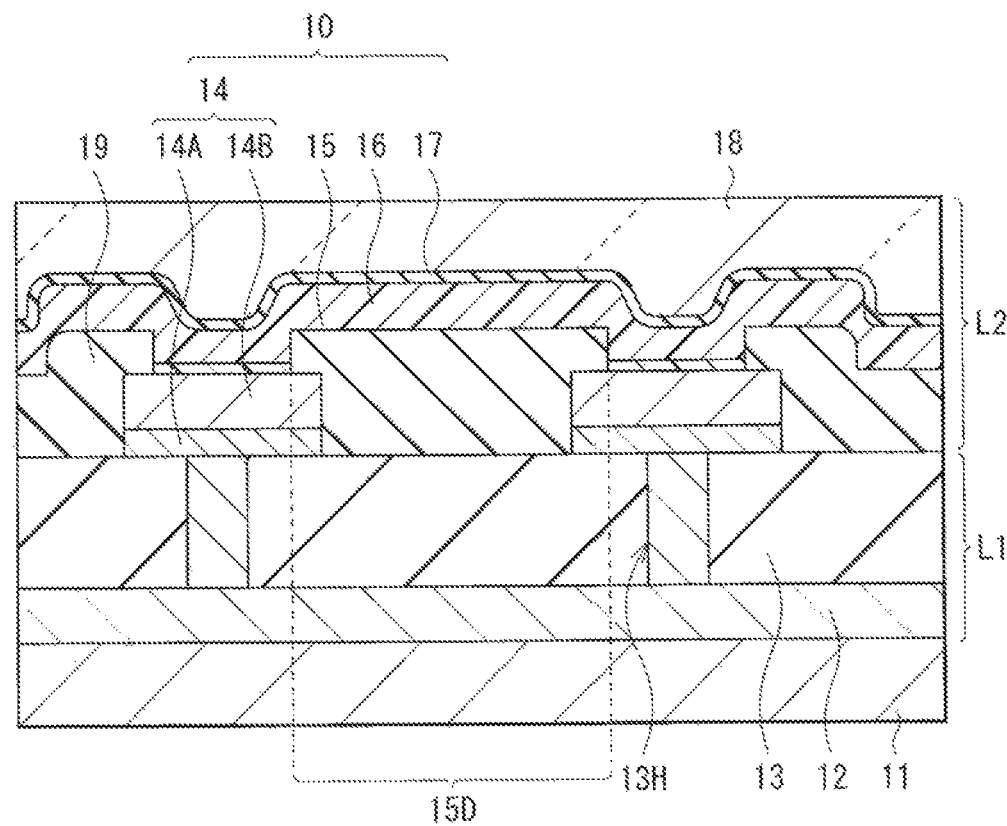

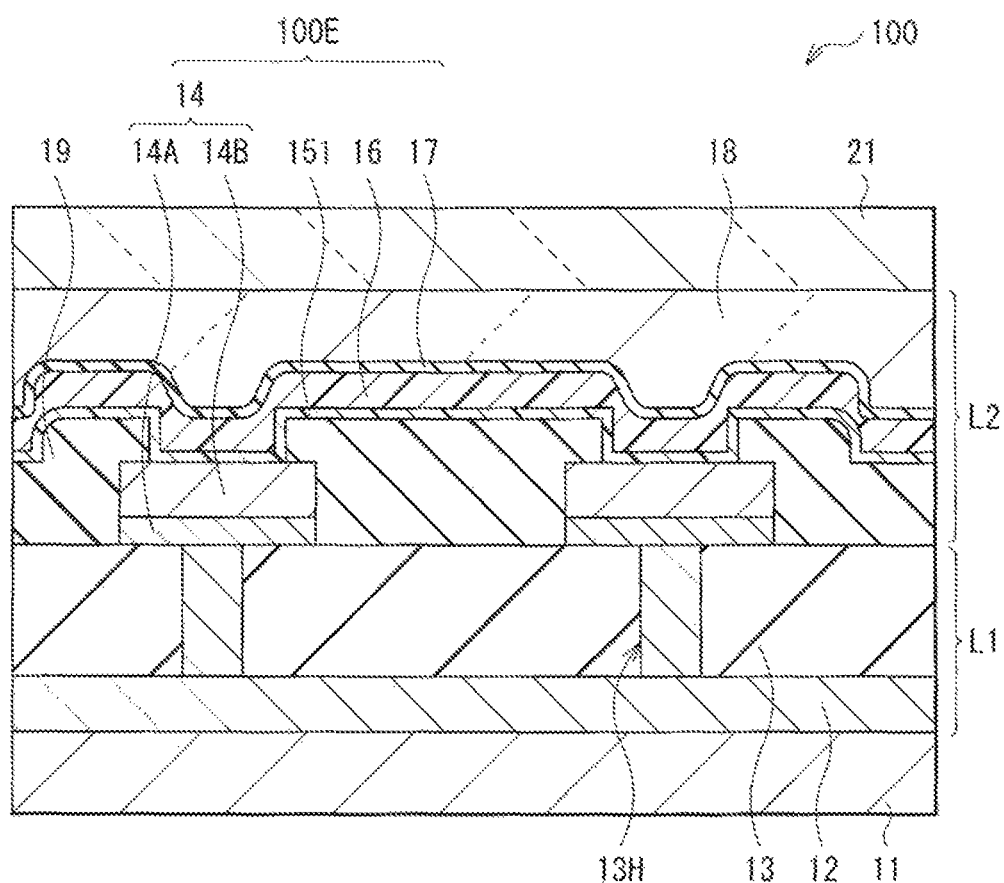
[FIG. 12]

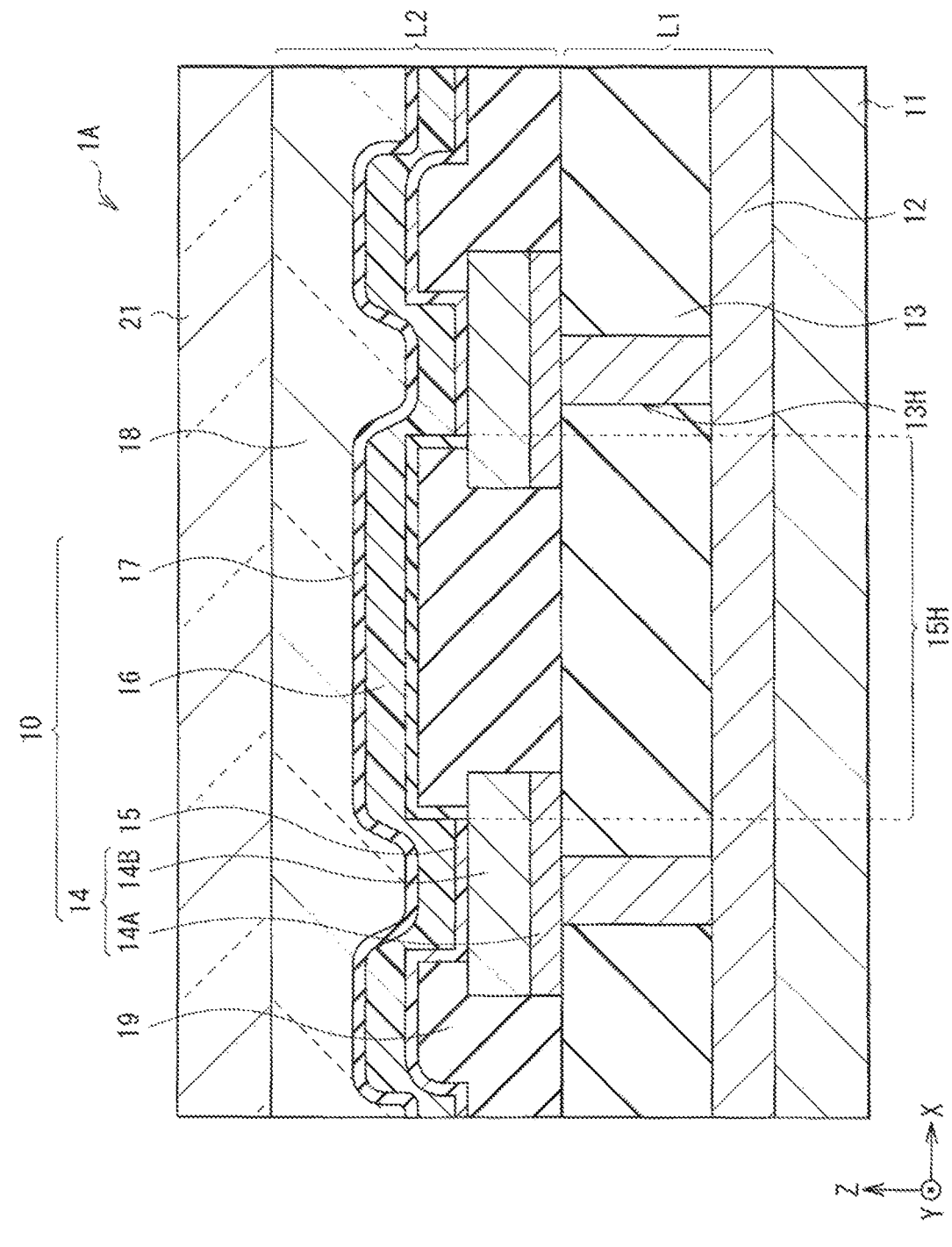
[FIG. 13]

[FIG. 14A]
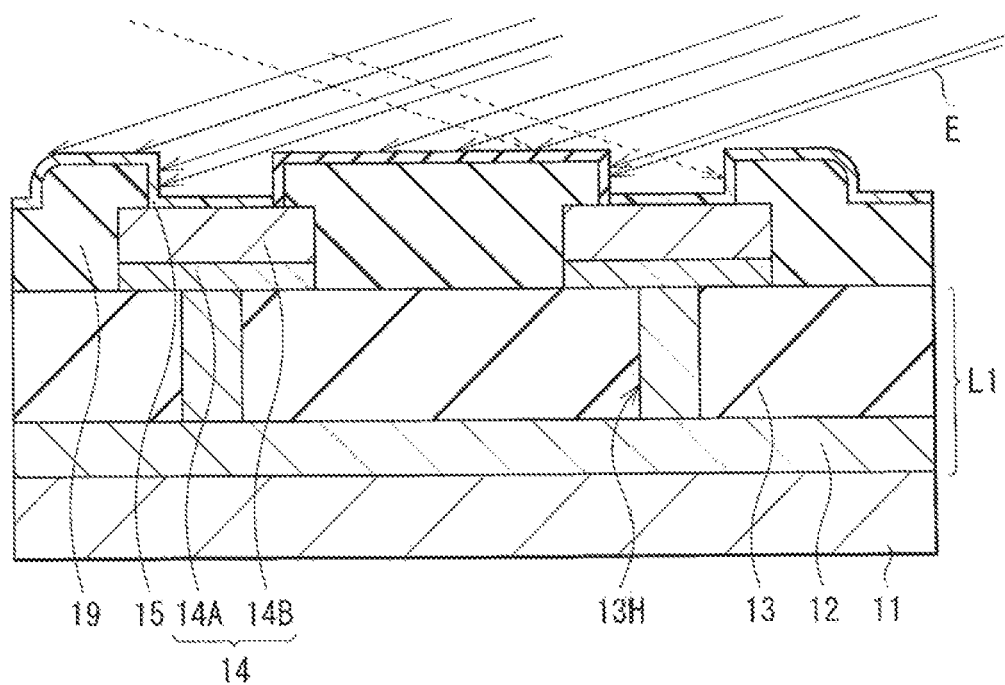
[FIG. 14B]
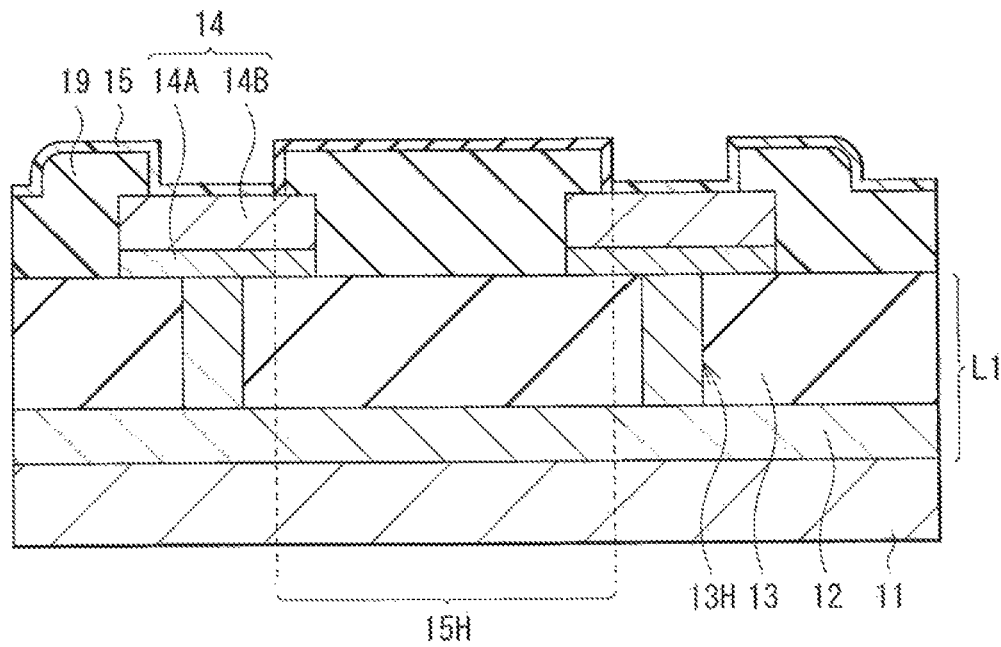

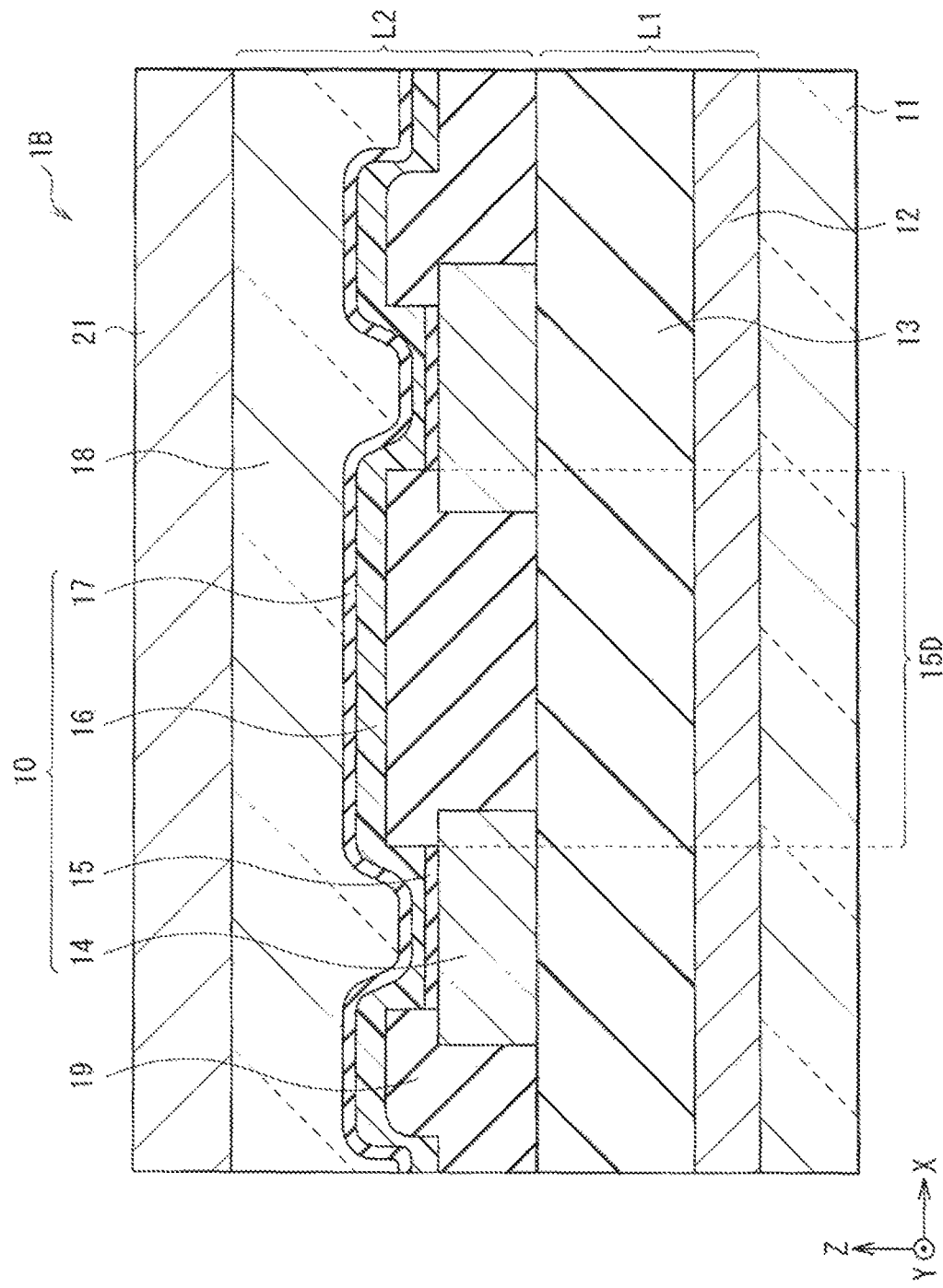
[FIG. 15]

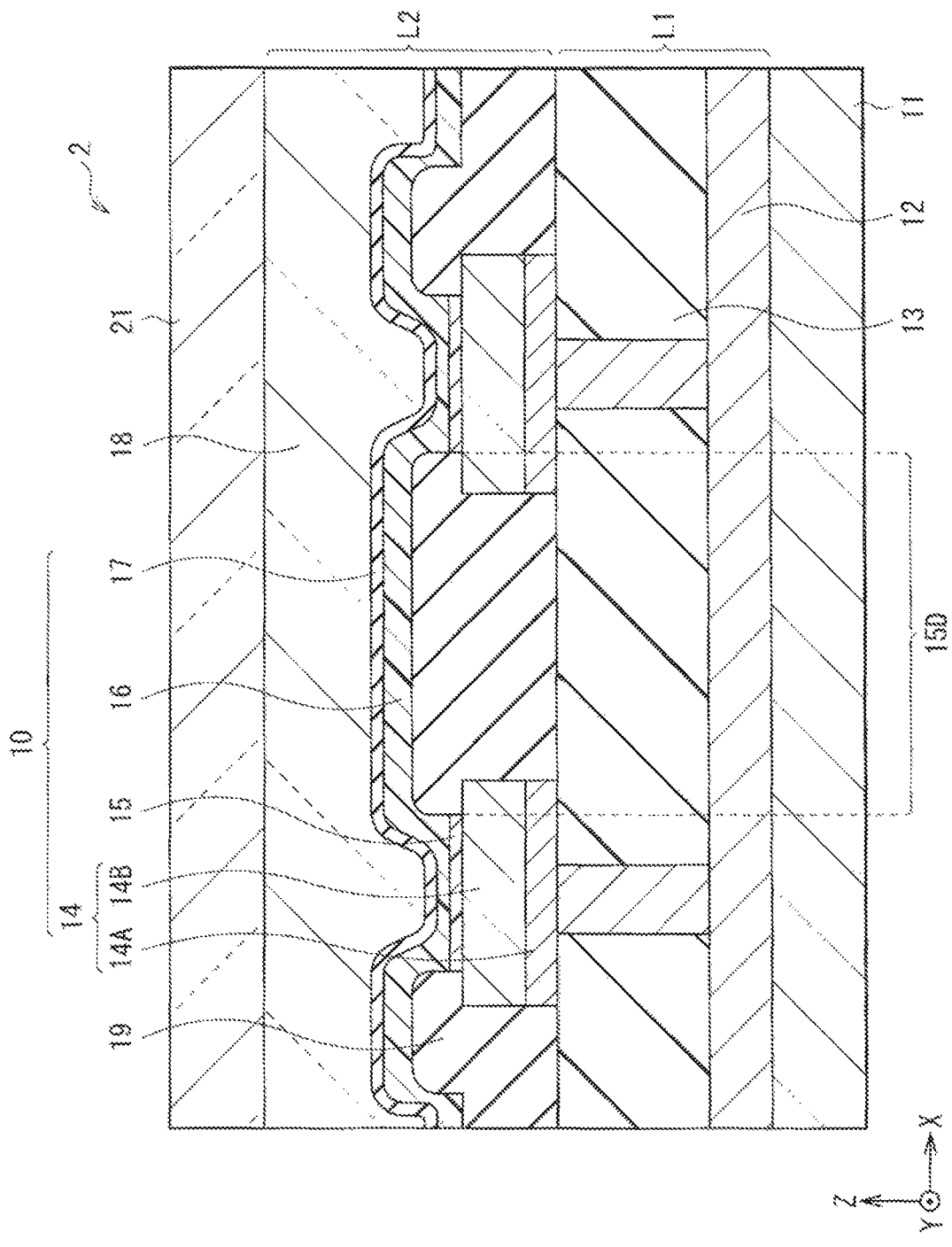
[FIG. 16]

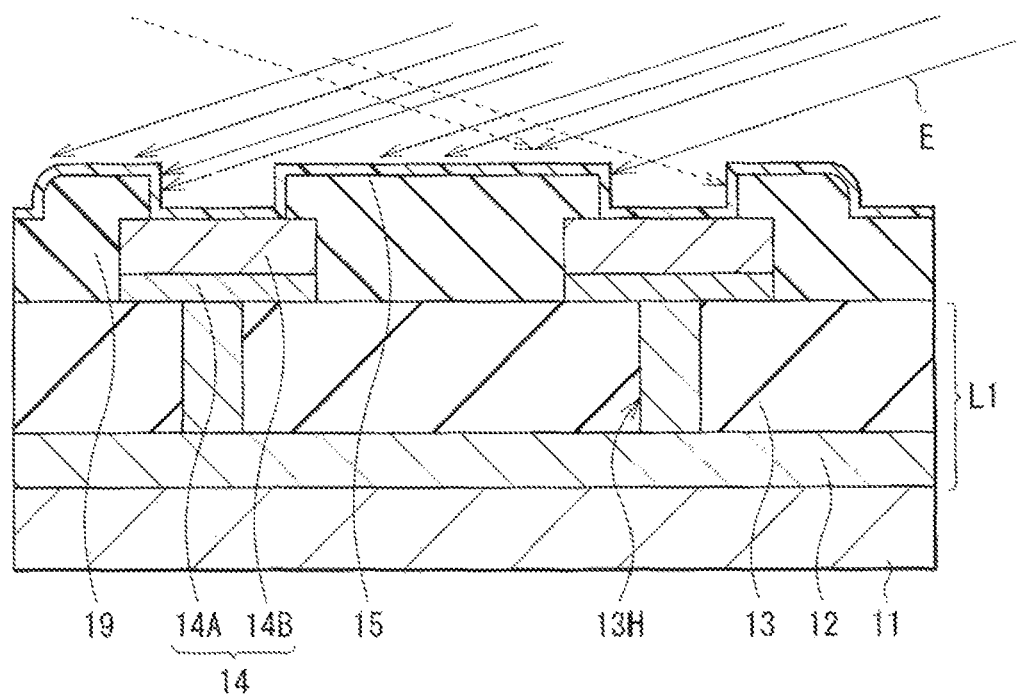
[FIG. 17]

[FIG. 18A]
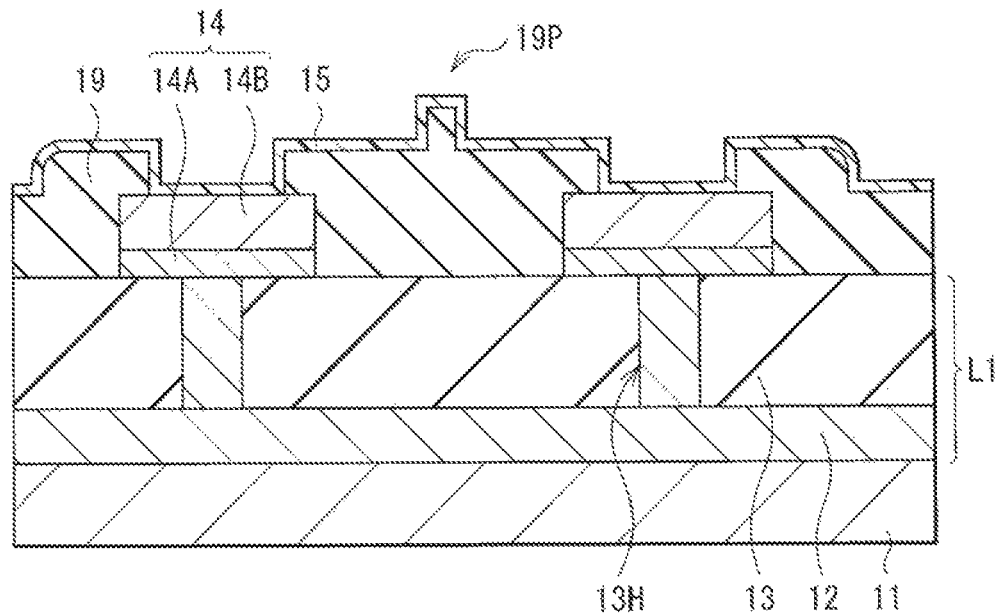
[FIG. 18B]
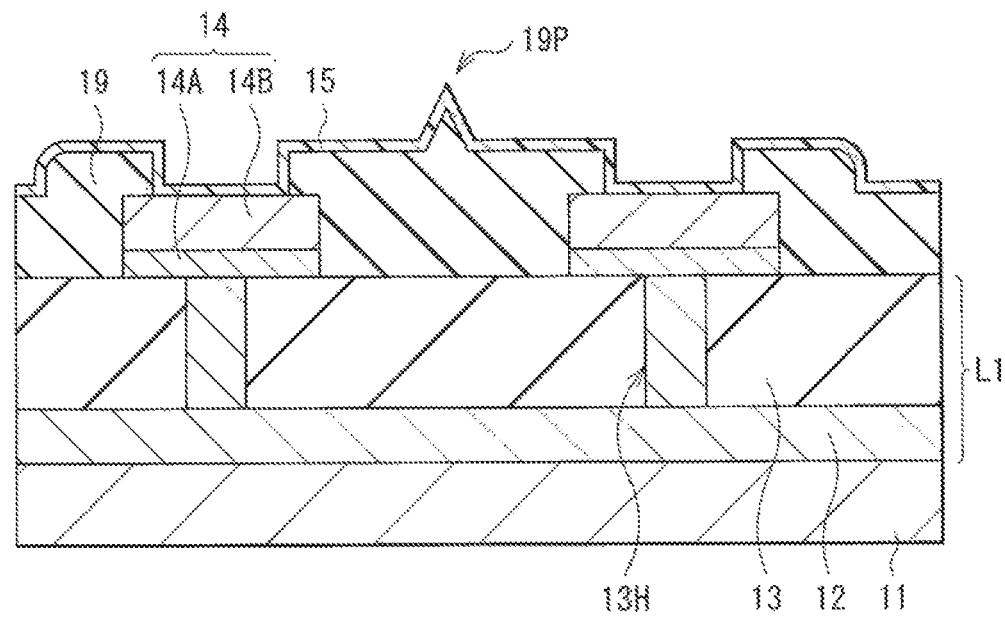

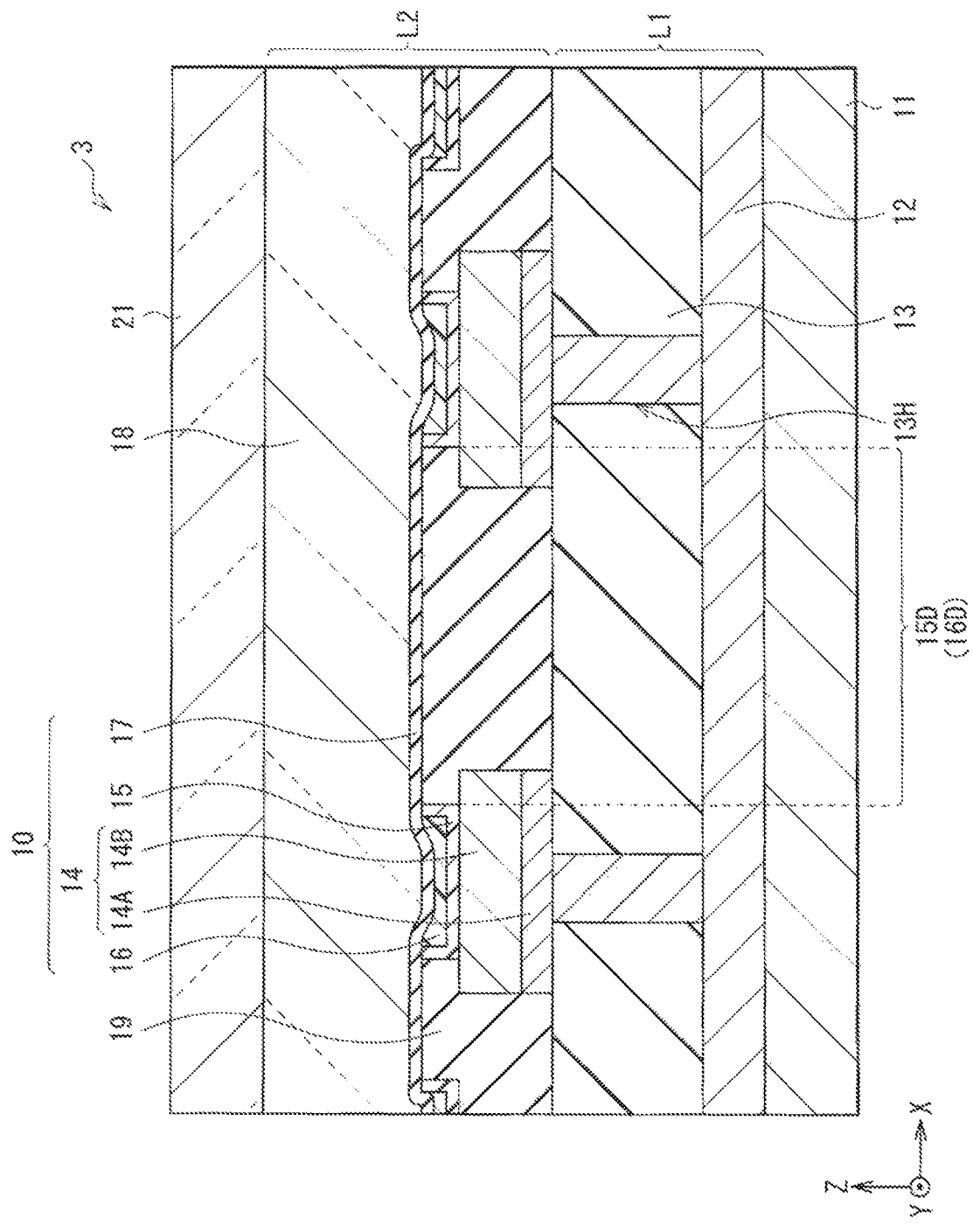
[FIG. 19]

[FIG. 20A]
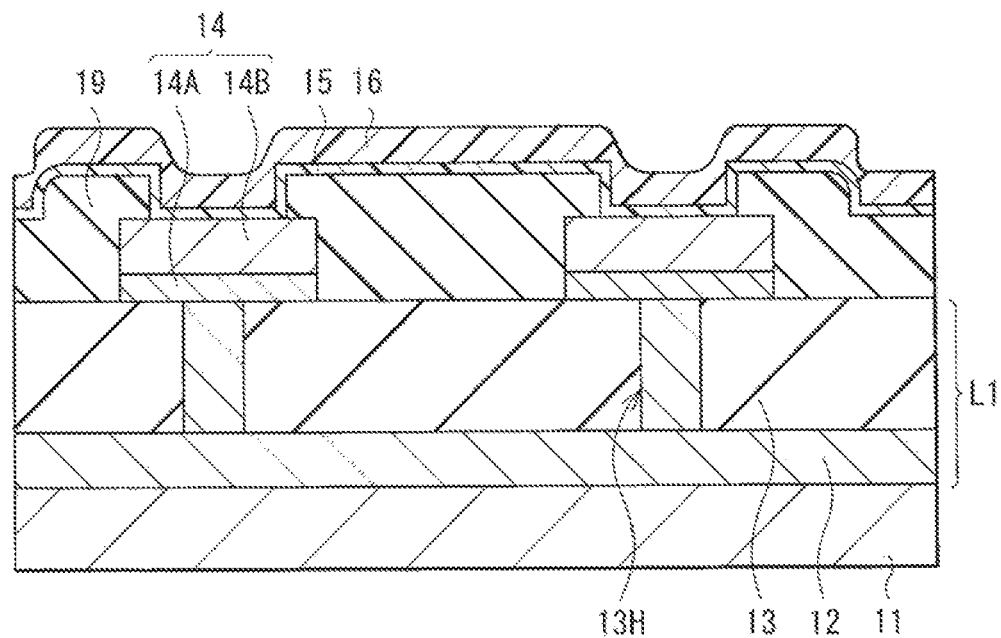
[FIG. 20B]
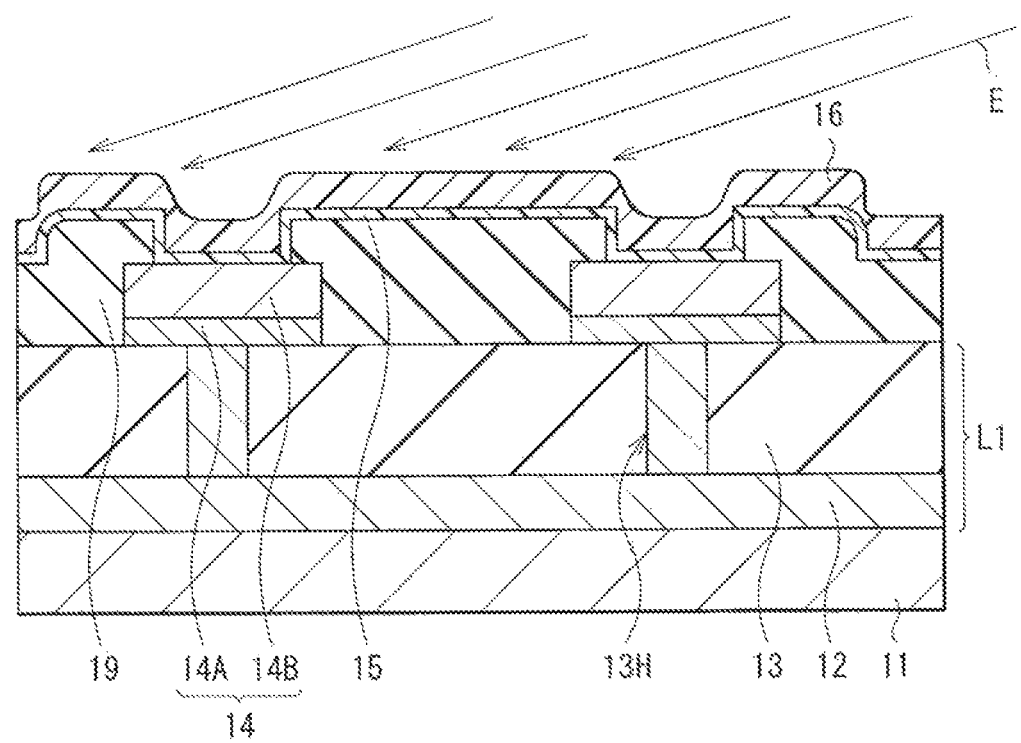

[FIG. 21A]
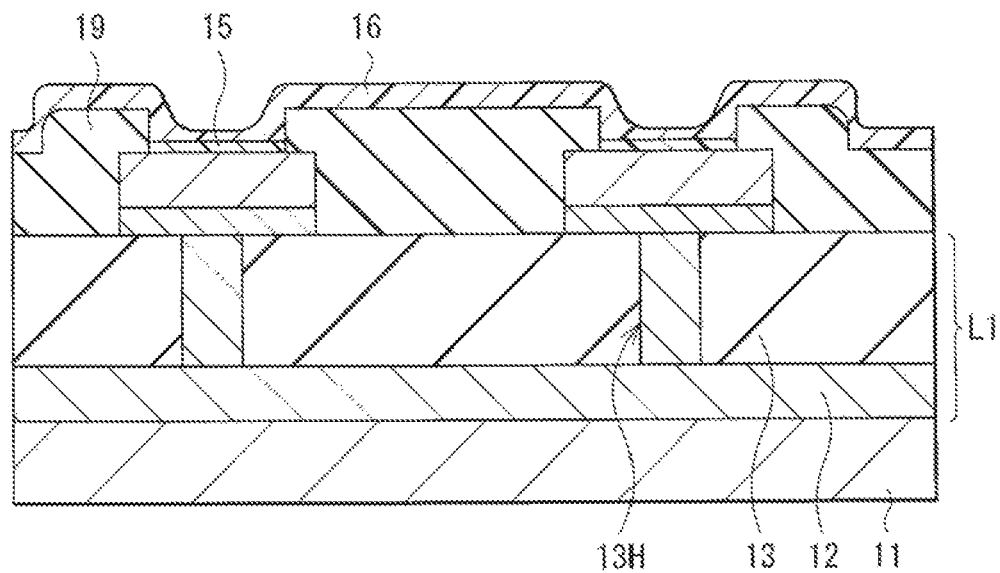
[FIG. 21B]
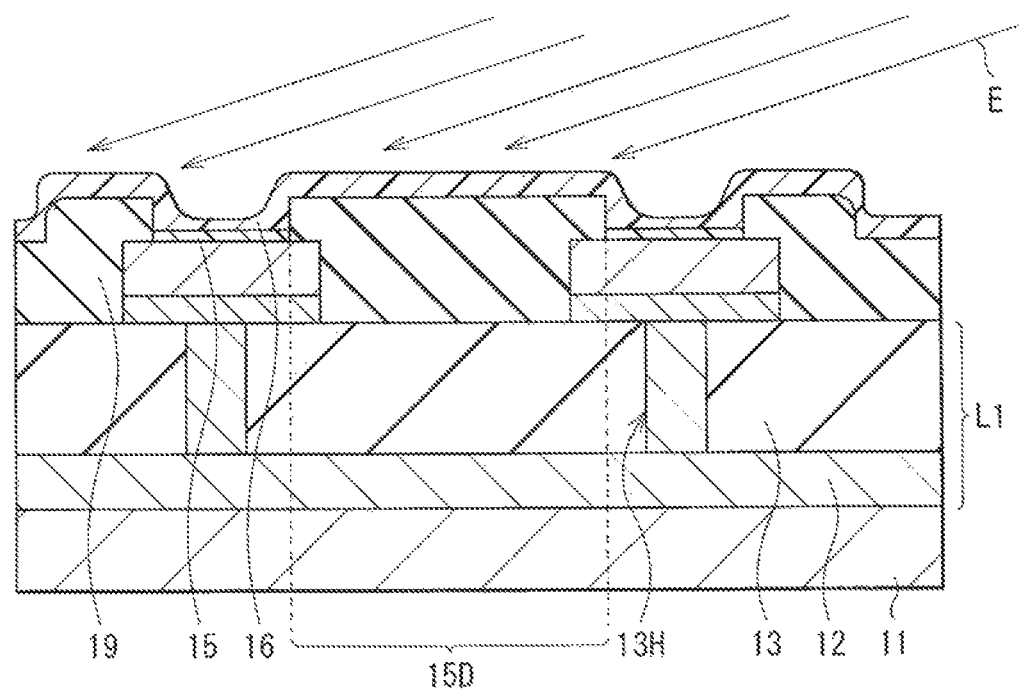

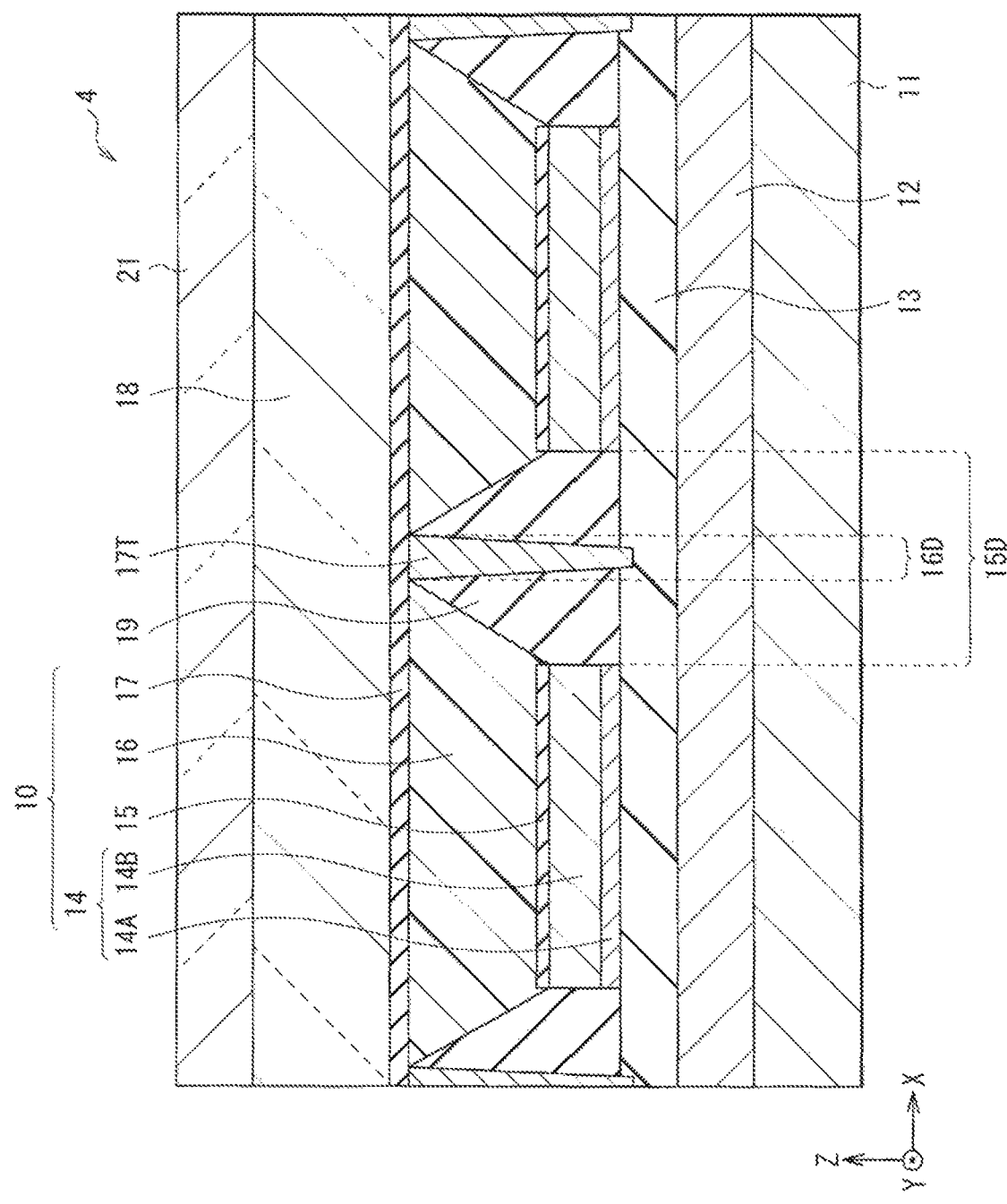
[FIG. 22]

[FIG. 23A]
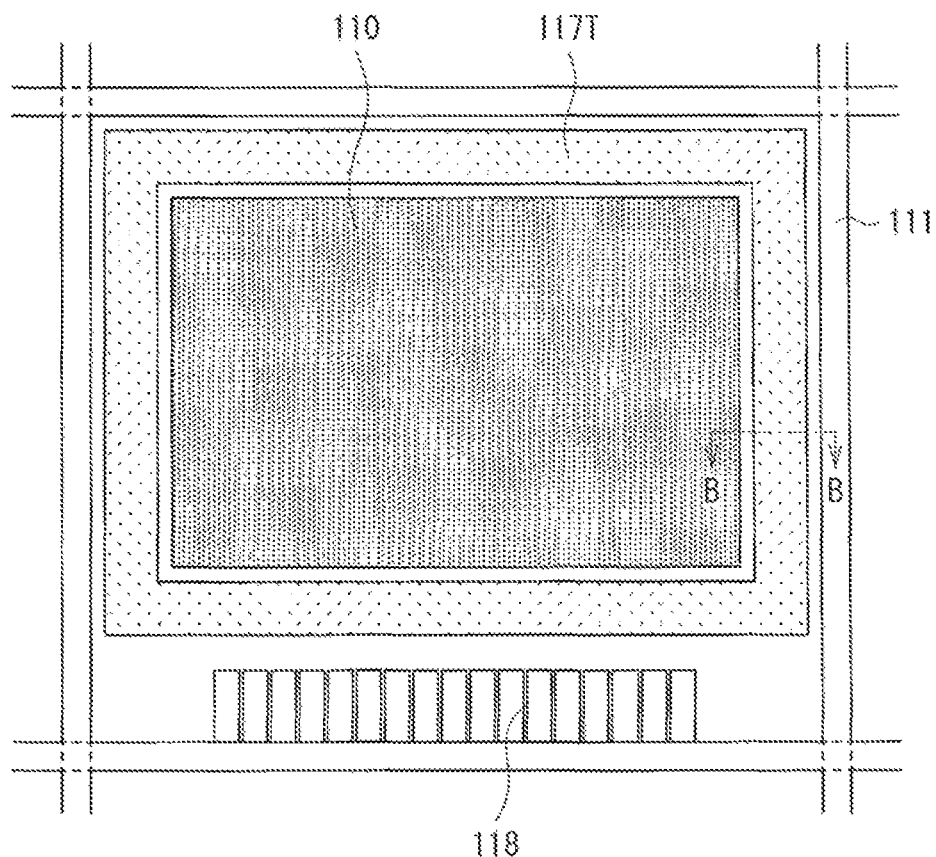
[FIG. 23B]
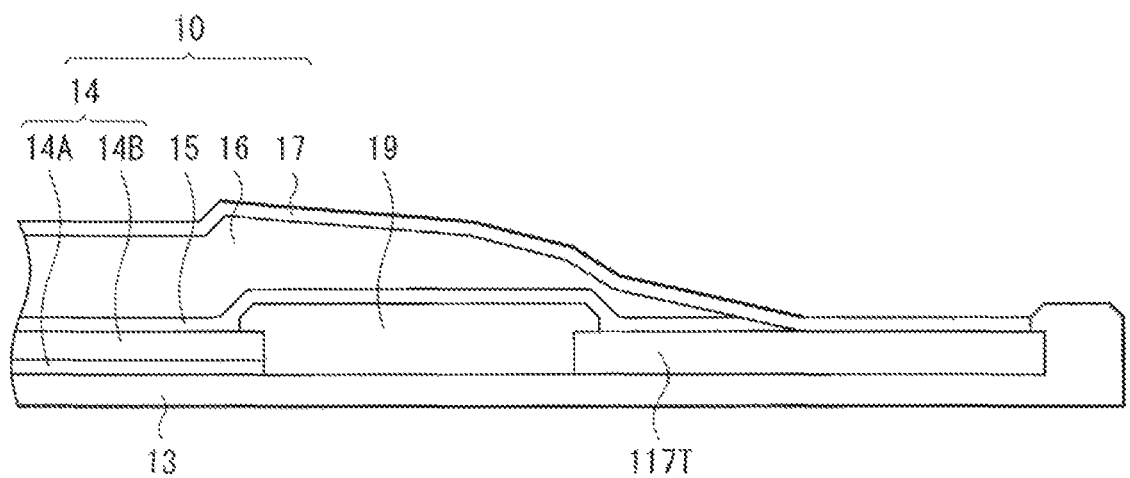

[FIG. 24A]
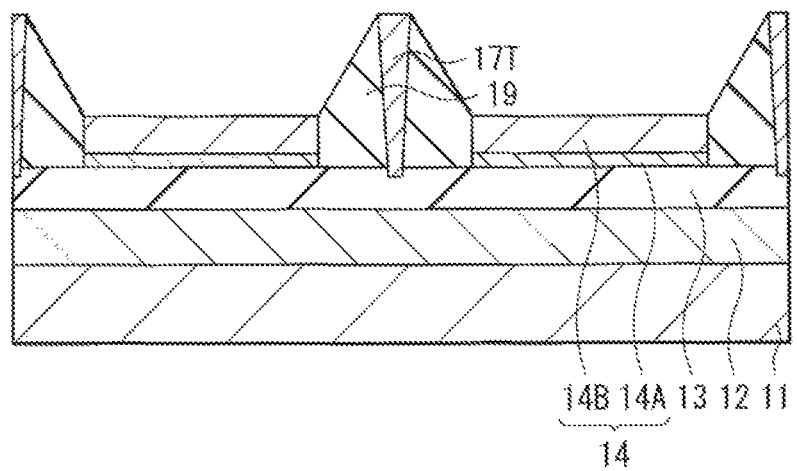
[FIG. 24B]
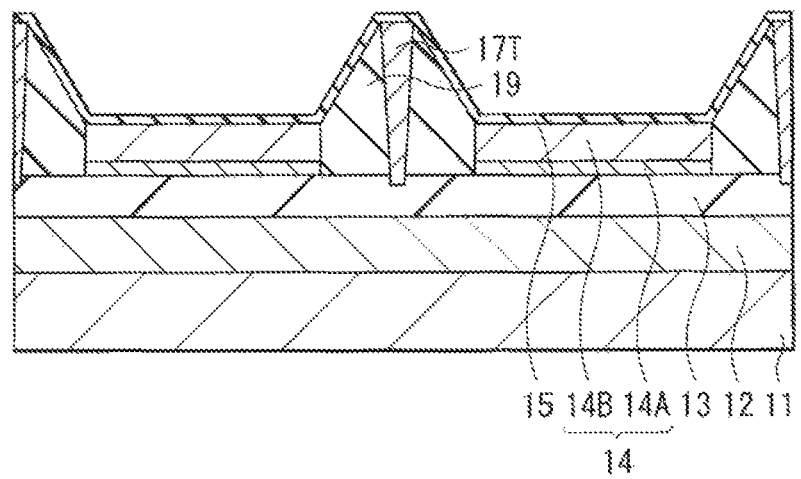
[FIG. 24C]
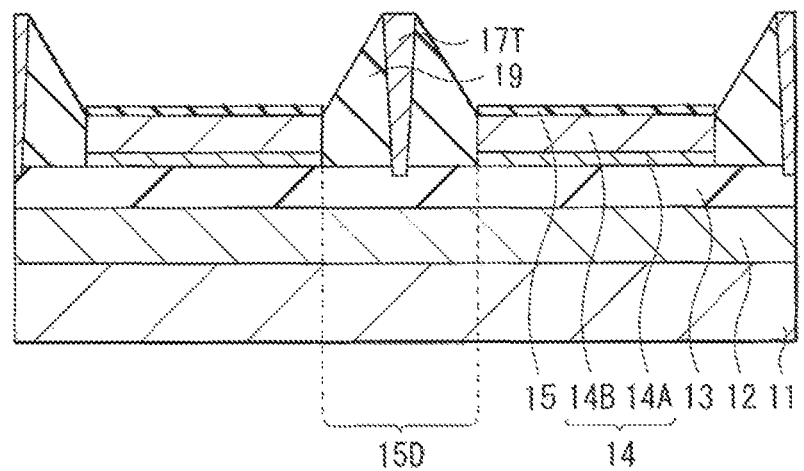

[FIG. 25A]
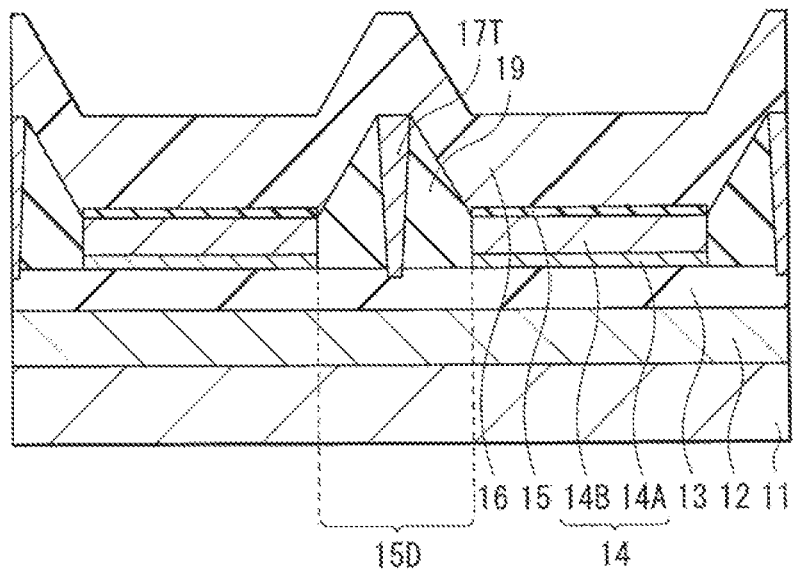
[FIG. 25B]
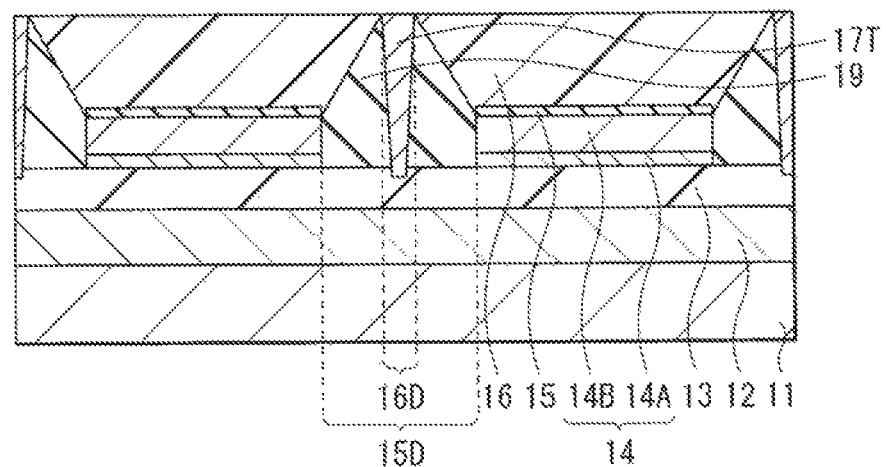
[FIG. 25C]
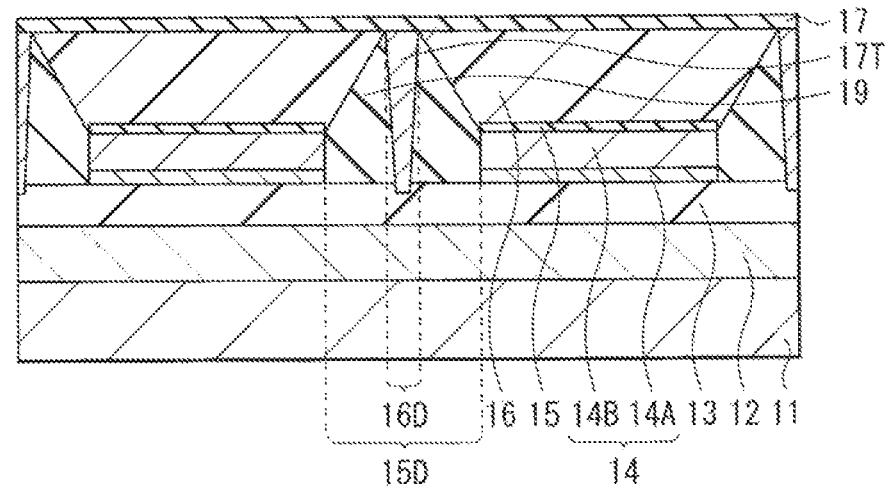

[FIG. 26]
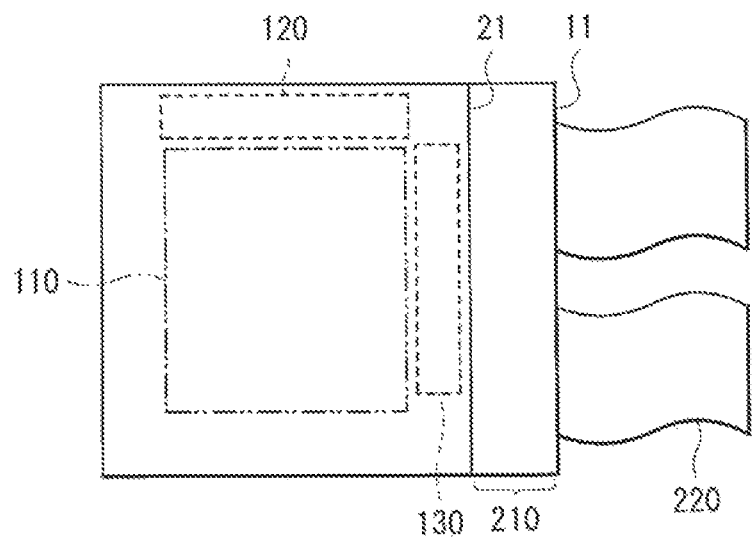
[FIG. 27]
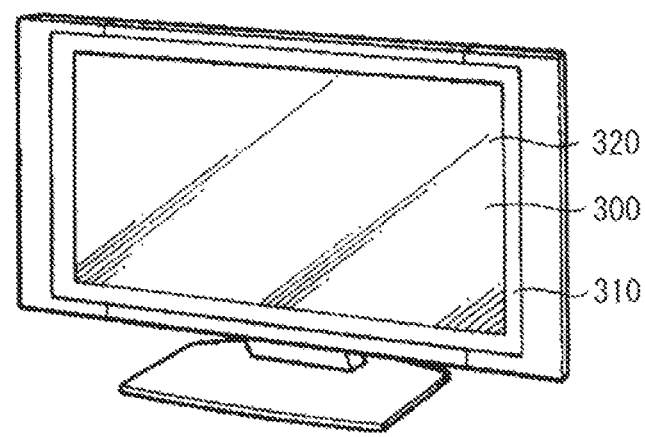

[FIG. 28A]
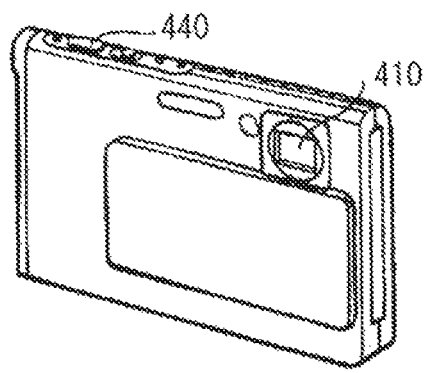
[FIG. 28B]
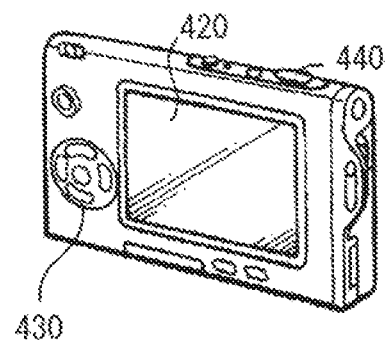

[ FIG. 29 ]
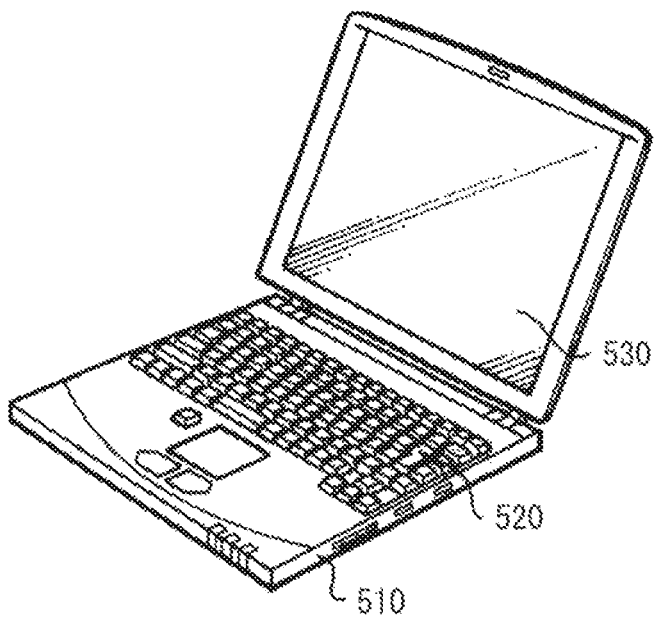
[ FIG. 30 ]
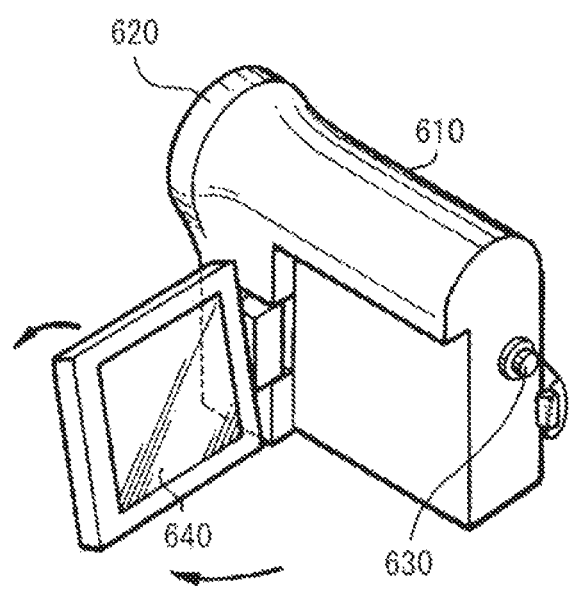

[FIG. 31A]
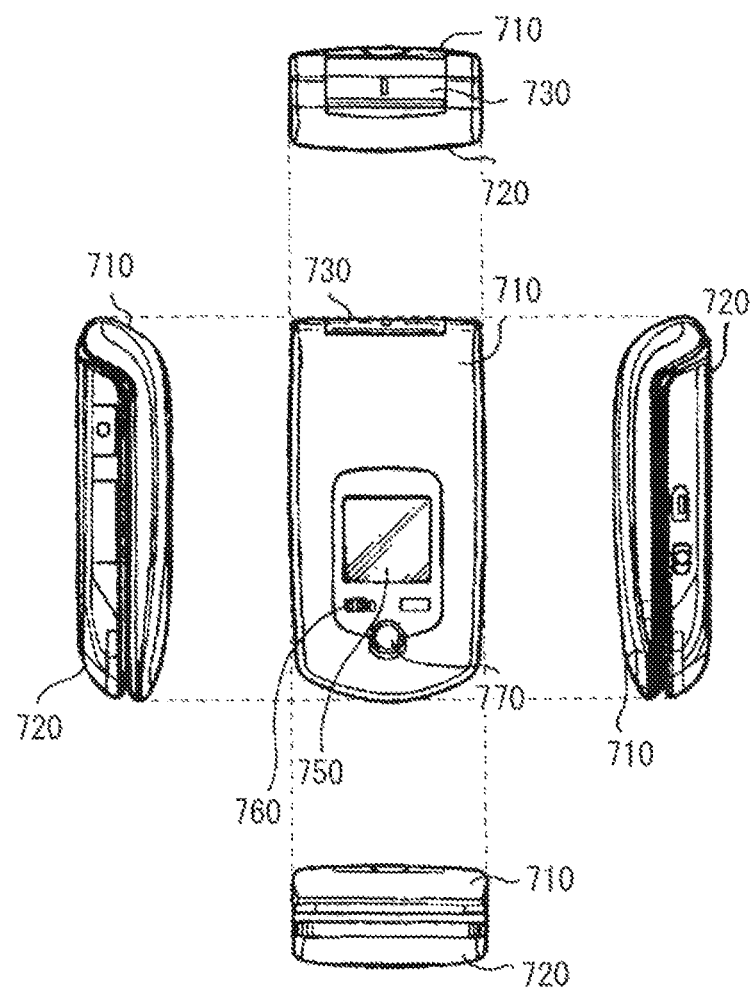

[FIG. 31B]
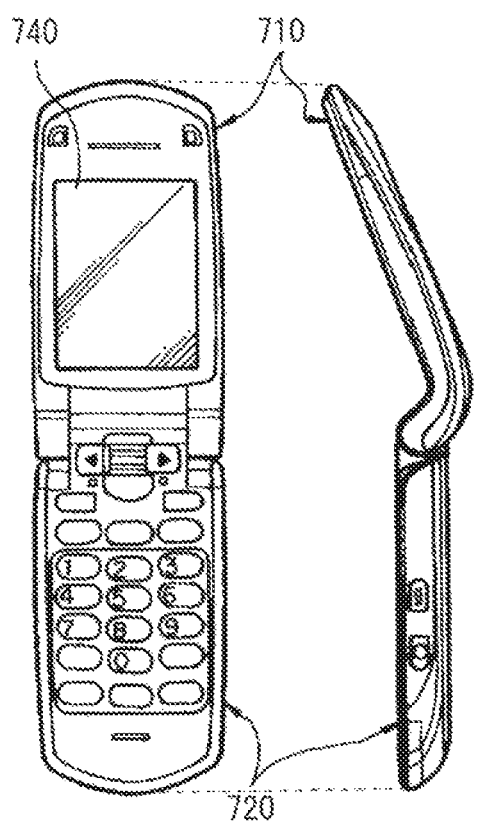

DISPLAY UNIT WITH PREVENTED CURRENT LEAKAGE, METHOD OF MANUFACTURING THE SAME, AND METHOD OF MANUFACTURING ELECTRONIC APPARATUS

CROSS-REFERENCE PARAGRAPH

The present application is a divisional application of U.S. patent application Ser. No. 14/417,229, filed Jan. 26, 2015, which is a national stage of PCT/JP2013/004418, filed Jul. 19, 2013, and claims the benefit of priority from prior Japanese Patent Application JP2012-172181, filed Aug. 2, 2012, the entire content of which is hereby incorporated by reference. Each of the above-referenced applications is hereby incorporated herein by reference in its entirety.

TECHNICAL FIELD

The technology relates to a display unit including functional layers such as a hole injection layer and a light-emitting layer, a method of manufacturing the display unit, and a method of manufacturing an electronic apparatus.

BACKGROUND ART

In recent years, a display using an organic electroluminescence (EL) device has attracted attention as one of flat panel displays. The display is a self-luminous type, and thus has characteristics of wide viewing angle and low power consumption. In addition, the organic EL device is considered to have sufficient responsiveness with respect to a high-speed video signal with high definition, and is being developed toward the practical use thereof.

The configuration of the organic EL device in which, for example, first electrodes, an organic layer including a light-emitting layer, and a second electrode are stacked in order is known. In a region between the first electrodes adjacent to each other (an inter-electrode region), a barrier formed of an insulating film is provided. As a method of forming the organic layer, there are two methods mainly, that is, a method in which light-emitting layers of respective colors of red, green, and blue are individually evaporated for each device with use of an evaporation mask, and a method in which light-emitting layers of respective colors of red, green and blue are stacked and formed to be common to devices without using an evaporation mask. The latter method is advantageous in terms of high definition and improvement in aperture ratio.

In the latter method, however, leakage of a drive current easily occurs between adjacent devices through the organic layer (in particular, a hole injection layer). Due to the leakage current, a non-light-emitting device emits light caused by influence from the light-emitting device, which results in color mixture and lowering in light emission efficiency.

In contrast, in PTL 1, a method in which a hole injection layer is increased in resistance between devices by a barrier provided in an inverted-tapered shape, and thus occurrence of leakage is prevented is proposed.

CITATION LIST

Patent Literature

[PTL 1] Japanese Unexamined Patent Application Publication No. 2009-4347

SUMMARY

Technical Problem

However, resistance of the hole injection layer is not sufficiently increased by the method in PTL1, and thus development of a method capable of preventing a leakage current more surely has been demanded.

It is desirable to provide a display unit capable of preventing occurrence of a leakage current more surely, a method of manufacturing the display unit, and a method of manufacturing an electronic apparatus.

Solution To Problem

According to an embodiment of the technology, there is provided a first method of manufacturing a display unit. The method includes: forming a plurality of first electrodes; forming a functional layer that covers from the first electrode to an inter-electrode region; and locally applying an energy ray to the functional layer to form a disconnecting section or a high-resistance section in the functional layer in the inter-electrode region.

According to an embodiment of the technology, there is provided a method of manufacturing an electronic apparatus. The method includes manufacturing a display unit. The manufacturing the display unit includes: forming a plurality of first electrodes; forming a functional layer that covers from the first electrode to an inter-electrode region; and locally applying an energy ray to the functional layer to form a disconnecting section or a high-resistance section in the functional layer in the inter-electrode region.

In the method of manufacturing the display unit or the method of manufacturing the electronic apparatus of the embodiment of the technology, the disconnecting section or the high-resistance section is formed in the functional layer by application of the energy ray, and therefore flow of a current through the functional layer is blocked by the inter-electrode region.

According to an embodiment of the technology, there is provided a display unit including: a plurality of first electrodes; and a functional layer covering from the first electrode to an inter-electrode region, and having a disconnecting section or a high-resistance section in the inter-electrode region, the disconnecting section or the high-resistance section being formed by local application of an energy ray.

In the display unit of the embodiment of the technology, flow of a current through the functional layer is blocked by the disconnecting section in the inter-electrode region.

According to an embodiment of the technology, there is a second method of manufacturing a display unit. The method includes: forming a plurality of first electrodes; forming a terminal and a burrier in an inter-electrode region of the first electrodes, the terminal being embedded in the barrier; applying an energy ray to the barrier to expose a surface of the terminal embedded in the barrier, and electrically connecting the terminal to a second electrode, the second electrode facing the first electrode with a functional layer in between.

In the second method of manufacturing the display unit according to the embodiment of the technology, the second electrode is electrically connected to the terminal embedded in the barrier. Therefore, a region in which an electrode pad for connecting the second electrode is provided is allowed to be eliminated. For example, the electrode pad provided in the periphery of the display region becomes unnecessary, and a region (a peripheral section) between the display region and a dicing region is allowed to be decreased. In addition, the barrier is shaved and smoothed by application of the energy ray, and thus disconnection of the second electrode is suppressed.

Advantageous Effects of Invention

According to the display unit, the method of manufacturing the display unit, and the method of manufacturing the electronic apparatus according to the respective embodiments of the technology, a disconnecting section or a high-resistance section is provided in a functional layer by application of an energy ray. Consequently, occurrence of a leakage current is more surely prevented.

It is to be understood that both the foregoing general description and the following detailed description are exemplary, and are intended to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 is a sectional diagram illustrating a structure of a display unit according to a first embodiment of the technology.

FIG. 2 is a diagram illustrating an entire configuration of the display unit illustrated in FIG. 1.

FIG. 3 is a diagram illustrating an example of a pixel drive circuit illustrated in FIG. 2.

FIG. 4 is a sectional diagram illustrating another example of a barrier illustrated in FIG. 1.

FIG. 5A is a sectional diagram illustrating a step of manufacturing the display unit illustrated in FIG. 1.

FIG. 5B is a sectional diagram illustrating a step following the step of FIG. 5A.

FIG. 5C is a sectional diagram illustrating a step following the step of FIG. 5B.

FIG. 6A is a sectional diagram illustrating a step following the step of FIG. 5C.

FIG. 6B is a sectional diagram illustrating a step following the step of FIG. 6A.

FIG. 6C is a sectional diagram illustrating a step following the step of FIG. 6B.

FIG. 7A is a sectional diagram illustrating a step following the step of FIG. 6C.

FIG. 7B is a sectional diagram illustrating a step following the step of FIG. 7A.

FIG. 8A is a sectional diagram illustrating a step following the step of FIG. 7B.

FIG. 8B is a sectional diagram illustrating a step following the step of FIG. 8A.

FIG. 9A is a sectional diagram illustrating a step following the step of FIG. 8B.

FIG. 9B is a sectional diagram illustrating a step following the step of FIG. 9A.

FIG. 10 is a sectional diagram illustrating another example of the step illustrated in FIG. 9A.

FIG. 11A is a sectional diagram illustrating a step following the step of FIG. 9B.

FIG. 11B is a sectional diagram illustrating a step following the step of FIG. 11A.

FIG. 12 is a sectional diagram illustrating a structure of a display unit according to a comparative example.

FIG. 13 is a sectional diagram illustrating a structure of a display unit according to a modification 1.

FIG. 14A is a sectional diagram illustrating a step of manufacturing the display unit illustrated in FIG. 13.

FIG. 14B is a sectional diagram illustrating a step following the step of FIG. 14A.

FIG. 15 is a sectional diagram illustrating a structure of a display unit according to a modification 2.

FIG. 16 is a sectional diagram illustrating a structure of a display unit according to a second embodiment of the technology.

FIG. 17 is a sectional diagram illustrating a step of manufacturing the display unit illustrated in FIG. 16.

FIG. 18A is a sectional diagram illustrating another example of the display unit illustrated in FIG. 16.

FIG. 18B is a sectional diagram illustrating another example of the display unit illustrated in FIG. 18A.

FIG. 19 is a sectional diagram illustrating a structure of a display unit according to a third embodiment of the technology.

FIG. 20A is a sectional diagram illustrating an example of a step of manufacturing the display unit illustrated in FIG. 19.

FIG. 20B is a sectional diagram illustrating a step following the step of FIG. 20A.

FIG. 21A is a sectional diagram illustrating another example of the step of manufacturing the display unit illustrated in FIG. 19.

FIG. 21B is a sectional diagram illustrating a step following the step of FIG. 21A.

FIG. 22 is a sectional diagram illustrating a structure of a display unit according to a fourth embodiment of the technology.

FIG. 23A is a plan view illustrating the structure of the display unit illustrated in FIG. 12.

FIG. 23B is a diagram illustrating a sectional structure taken along a B-B line in FIG. 23A.

FIG. 24A is a sectional diagram illustrating a step of manufacturing the display unit illustrated in FIG. 22.

FIG. 24B is a sectional diagram illustrating a step following the step of FIG. 24A.

FIG. 24C is a sectional diagram illustrating a step following the step of FIG. 24B.

FIG. 25A is a sectional diagram illustrating a step following the step of FIG. 24C.

FIG. 25B is a sectional diagram illustrating a step following the step of FIG. 25A.

FIG. 25C is a sectional diagram illustrating a step following the step of FIG. 25B.

FIG. 26 is a plan view illustrating a schematic configuration of a module including the display unit illustrated in FIG. 1 and the like.

FIG. 27 is a perspective view illustrating an appearance of an application example 1.

FIG. 28A is a perspective view illustrating an appearance of an application example 2 viewed from a front side thereof.

FIG. 28B is a perspective view illustrating the appearance of the application example 2 viewed from a back side thereof.

FIG. 29 is a perspective view illustrating an appearance of an application example 3.

FIG. 30 is a perspective view illustrating an appearance of an application example 4.

FIG. 31A is a diagram illustrating an application example 5 in a closed state.

FIG. 31B is a diagram illustrating the application example 5 in an open state.

DESCRIPTION OF EMBODIMENTS

Some embodiments of the present technology will be described in detail below referring to the accompanying drawings. It is to be noted that description will be given in the following order.
1. First embodiment (a display unit in which a disconnecting section is provided in a hole injection layer: top-emission type)
2. Modification 1 (a display unit in which a high-resistance section is provided in a hole injection layer)
3. Modification 2 (a display unit in which a disconnecting section is provided in a hole injection layer: bottom-emission type)
4. Second embodiment (a display unit in which a barrier is smoothed by application of an energy ray)
5. Third embodiment (a display unit in which a disconnecting section is provided in a light-emitting layer in addition to a hole injection layer)
6. Fourth embodiment (a display unit in which a terminal is embedded in a barrier)

First Embodiment

Entire Configuration of Display Unit

FIG. 1 illustrates a sectional structure of a main part of a display unit (a display unit 1) according to a first embodiment of the technology. The display unit 1 is a self-luminous display unit including a plurality of organic EL devices 10, and includes a pixel drive circuit forming layer L1, a light emitting device forming layer L2 including the organic EL devices 10, and a counter substrate 21 in this order on a support substrate 11. The display unit 1 is a so-called top-emission type display unit having a light extraction direction on the counter substrate 21 side. The pixel drive circuit forming layer L1 may include, for example, a signal line drive circuit and a scan line drive circuit (both not illustrated) for picture display. Detail of each component will be described later.

FIG. 2 illustrates an entire configuration of the display unit 1. The display unit 1 includes a display region 110 on the support substrate 11, and is used as an extra-thin organic light emission color display unit. For example, a signal line drive circuit 120, a scan line drive circuit 130, and a power supply line drive circuit 140 that are drivers for picture display may be provided in the periphery of the display region 110 on the support substrate 11.

In the display region 110, the plurality of organic EL devices 10 (10R, 10G, and 10B) that are arranged two-dimensionally in a matrix, and a pixel drive circuit 150 driving the organic EL devices 10 are provided. The organic EL devices 10R, 10G, and 10B emit light of red, green, and blue, respectively. In the pixel drive circuit 150, a plurality of signal lines 120A (120A1, 120A2, . . . , 120Am, . . . ) and a plurality of power supply lines 140A (140A1, . . . , 140An, . . . ) are arranged in a column direction (Y direction), and a plurality of scan lines 130A (130A1, . . . , 130An, . . . ) are arranged in a row direction (X direction). One of the organic EL devices 10R, 10G, and 10B is provided in an intersection of each of the signal lines 120A and each of the scan lines 130A. Both ends of each signal line 120A are connected to the signal line drive circuit 120, both ends of each scan line 130A are connected to the scan line drive circuit 130, and both ends of each power supply line 140A are connected to the power supply line drive circuit 140.

The signal line drive circuit 120 supplies, through the signal line 120A, a signal voltage of a picture signal corresponding to luminance information supplied from a signal supply source (not illustrated) to the selected organic EL devices 10R, 10G, and 10B. A signal voltage from the signal line drive circuit 120 is applied to both ends of the signal line 120A.

The scan line drive circuit 130 is configured of a shift register or the like that sequentially shifts (transfers) a start pulse in synchronization with an input clock pulse. The scan line drive circuit 130 scans the organic EL devices 10R, 10G, and 10B for each row at the time of writing the picture signal, and sequentially supplies the scan signal to each of the scan lines 130A. The scan signal is supplied from the scan line drive circuit 130 to both ends of the scan line 130A.

The power supply line drive circuit 140 is configured of a shift resistor or the like that sequentially shifts (transfers) a start pulse in synchronization with an input clock pulse. The power supply line drive circuit 140 appropriately supplies one of a first potential and a second potential that are different from each other, to both ends of each power supply line 140A in synchronization with the scan for each column by the signal line drive circuit 120. As a result, a conduction state or a non-conduction state of a drive transistor Tr1 described later is selected.

The pixel drive circuit 150 is provided in a layer between the support substrate 11 and the organic EL devices 10, that is, in the pixel drive circuit forming layer L1 (a TFT layer 12 described later). FIG. 3 illustrates a configuration example of the pixel drive circuit 150. The pixel drive circuit 150 is an active drive circuit including the drive transistor Tr1 and a write transistor Tr2, a capacitor (a retention capacitance) Cs therebetween, and the organic EL device 10. The organic EL device 10 is connected in series with the drive transistor Tr1 between the power supply line 140A and a common power supply line (GND). The drive transistor Tr1 and the write transistor Tr2 are each configured of a typical thin film transistor (TFT), and the configuration thereof may be an inverted-staggered structure (a so-called bottom gate type) or a staggered structure (a top gate type), and is not particularly limited.

For example, the write transistor Tr2 has a drain electrode connected to the signal line 120A, and receives a picture signal from the signal line drive circuit 120. In addition, the write transistor Tr2 has a gate electrode connected to the scan line 130A, and receives a scan signal from the scan line drive circuit 130. Further, the write transistor Tr2 has a source electrode connected to a gate electrode of the drive transistor Tr1.

For example, the drive transistor Tr1 has a drain electrode connected to the power supply line 140A, and the drain electrode is set to one of the first potential and the second potential by the power supply line drive circuit 140. The drive transistor Tr1 has a source electrode connected to the organic EL device 10.

The retention capacitance Cs is formed between the gate electrode of the drive transistor Tr1 (the source electrode of the write transistor Tr2) and the drain electrode of the drive transistor Tr1.

Configuration of Main Part of Display Unit

Next, with reference to FIG. 1 again, detailed configurations of the support substrate 11, the pixel drive circuit forming layer L1, the light-emitting element forming layer L2, the counter substrate 21, and the like are described. The organic EL devices 10R, 10G, and 10B have a common configuration which will be given collectively.

The support substrate 11 is formed of glass, a silicon (Si) wafer, resin, a conductive material, or the like. The support substrate 11 may be formed of a transmissive material or a non-transmissive material because light is extracted from the counter substrate 21 in the top-emission type. When a conductive substrate is used, a surface is insulated by silicon oxide ($SiO_2$) or resin.

The pixel drive circuit forming layer L1 has a stacked structure including the TFT layer 12 and a planarization layer 13. In the pixel drive circuit forming layer L1, the drive transistor Tr1 and the write transistor Tr2 that configure the pixel drive circuit 150 are provided, and the signal line 120A, the scan line 130A, and the power supply line 140A (not illustrated) are also embedded.

The configuration of the TFT (the drive transistor Tr1 and the write transistor Tr2) of the TFT layer 12 is not particularly limited, and for example, a semiconductor layer may be formed using amorphous silicon (a-Si), an oxide semiconductor, an organic semiconductor, or the like. In addition, the drive transistor Tr1 and the write transistor Tr2 may be configured of metal oxide semiconductor field effect transistor (MOSFET).

The planarization layer 13 planarizes the surface of the support substrate 11 formed with the pixel drive circuit 150, and may be preferably formed of a material having higher pattern accuracy because fine connection hole 13H is to be provided. The drive transistor Tr1 of the TFT layer 12 is electrically connected to the organic EL device 10 (a first electrode 14 described later) through the connection hole 13H provided in the planarization layer 13. The connection hole 13H is provided with a plug formed of a conductive metal. Examples of the material of the planarization layer 13 may include an organic material such as polyimide, and an inorganic material such as silicon oxide ($SiO_2$), silicon nitride (SiNx), and silicon oxynitride (SiON).

In the light-emitting device forming layer L2, the organic EL devices 10, the barrier 19, and a protective layer 18 covering the organic EL devices 10 and the barrier 19 are provided.

Each of the organic EL device 10 is configured by stacking the first electrode 14 as an anode electrode, the organic layer including the hole injection layer 15 and the light-emitting layer 16, and a second electrode 17 as a cathode electrode in order from the support substrate 11 side.

The first electrode 14 is provided for each organic EL device 10, and the plurality of first electrodes 14 are arranged to be distanced from one another on the planarization layer 13. The first electrode 14 has a function as an anode and a function as a reflective layer, and may be desirably formed of a material having high reflectance and high hole injection property. Such a first electrode 14 may have, for example, a thickness in a stacking direction (hereinafter, simply referred to as a thickness) of 30 nm or more and 1000 nm or less, and examples of the material thereof may include metal elements such as chromium (Cr), gold (Au), platinum (Pt), nickel (Ni), copper (Cu), molybdenum (Mo), tungsten (W), titanium (Ti), tantalum (Ta), aluminum (Al), and silver (Ag), and an alloy thereof. For example, the first electrode 14 of the display unit 1 may have a stacked structure of first electrodes 14A and 14B. For example, titanium may be used for the first electrode 14A in a lower layer (on the planarization layer 13 side), and aluminum may be used for the first electrode 14B in an upper layer (on the hole injection layer 15 side).

The barrier 19 is provided between the first electrodes 14 adjacent to each other (in an inter-electrode region), and covers an end of the surface of the first electrode 14 (the first electrode 14B). The barrier 19 rises from the surface of the first electrode 14 toward the second electrode 17 side, and surrounds the first electrode 14 with the side surface of the barrier 19 (an opening). The barrier 19 is provided to ensure insulation property between the first electrode 14 and the second electrode 17 and between the organic EL devices 10 adjacent to each other, and to control the light-emitting region into a desired shape accurately. The opening of the barrier 19 on the first electrode 14 corresponds to the light-emitting region. For example, the size of the opening of the barrier 19 may be uniform from the first electrode 14 to the second electrode 17 (in a depth direction), namely, the cross-sectional surface (XZ cross-sectional surface) of the barrier 19 has a substantially rectangular shape. As illustrated in FIG. 4, the cross-sectional surface of the barrier 19 may have a forward tapered shape, and the opening may be increased from the first electrode 14 toward the second electrode 17. For example, the barrier 19 may be formed of silicon oxide, silicon nitride, or silicon oxynitride, and may have a thickness of 10 nm or more.

The organic layer including the hole injection layer 15 and the light-emitting layer 16 has the same structure irrespective of the color of light emitted from the organic EL device 10 (10R, 10G, and 10B), and may be configured by stacking, for example, the hole injection layer 15, a hole transport layer (not illustrated), the light-emitting layer 16, an electron transport layer (not illustrated), and an electron injection layer (not illustrated) in this order from the first electrode 14 side. The hole injection layer 15 is a buffer layer for increasing hole injection efficiency and for preventing leakage. In the first embodiment, a disconnecting section 15D of the hole injection layer 15 is provided in the inter-electrode region. Accordingly, occurrence of a leakage current through the hole injection layer 15 is allowed to be prevented.

Although the detail will be described later, the disconnecting section 15D is a section formed by removing the hole injection layer 15 by irradiation of the energy ray. The current flowing between the organic EL devices 10 through the hole injection layer 15 is blocked by the disconnecting section 15D. Although the disconnection section 15D is preferably formed over the inter-electrode region, may be provided in at least a part of the inter-electrode region. For example, the disconnecting section 15D may be provided at the same position (planar view) as the surface of the barrier 19 (FIG. 1).

For example, the hole injection layer 15 may have a thickness of 1 nm or more and 300 nm or less, and may be formed of a hexaazatriphenylene derivative illustrated in Chemical Formula 1 or 2.

[Chem. 1]

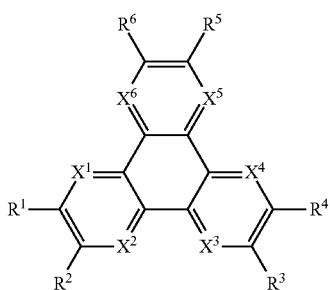

where $R^1$ to $R^6$ each are independently a substituted group selected from a group of hydrogen, halogen, a hydroxyl group, an amino group, an arylamino group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a substituted or unsubstituted aryl group with 30 or less carbon atoms, a substituted or unsubstituted heterocyclic group with 30 or less carbon atoms, a nitrile group, a cyano group, a nitro group, and a silyl group, and adjacent groups $R^m$, where m=1 to 6, may be joined together through a cyclic structure, and $X^1$ to $X^6$ each are independently a carbon atom or a nitrogen atom.

[Chem. 2]

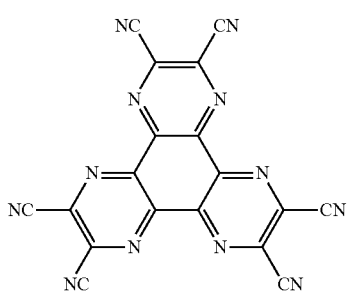

The hole transport layer is to increase the hole transport efficiency to the light-emitting layer 16. For example, the hole transport layer may have a thickness of about 40 nm, and may be formed of 4,4',4''-tris(3-metylphenylphenylamino)triphenylamine (m-MTDATA) or a-naphtylphenyldiamine (aNPD). The hole transport layer, the light-emitting layer 16, the electron transport layer, and the electron injection layer are common to all of the organic EL devices 10, and are also provided in the inter-electrode region. In other words, in the disconnecting section 15D of the hole injection layer 15, for example, the hole transport layer may be in contact with the barrier 19.

The light-emitting layer 16 is a light-emitting layer for emitting white light, and for example, may include a red light-emitting layer, a green light-emitting layer, and a blue light-emitting layer (all not illustrated) that are stacked between the first electrode 14 and the second electrode 17. The red light-emitting layer, the green light-emitting layer, and the blue light-emitting layer generate red light, green light, and blue light, respectively, by recombination of a part of holes that are injected from the first electrode 14 through the hole injection layer 15 and the hole transport layer and a part of electrons that are injected from the second electrode 17 through the electron injection layer and the electron transport layer, in response to application of an electric field.

For example, the red light-emitting layer may include one or more of a red light-emitting material, a hole transport material, an electron transport material, and a both charge transport material. The red light-emitting material may be a fluorescent material or a phosphorescent material. For example, the red light-emitting layer may have a thickness of about 5 nm, and may be formed of 4,4-bis(2,2-diphenyl-vinyl)biphenyl (DPVBi) mixed with 30 wt % of 2,6-bis[(4'-methoxydiphenylamino)styryl]-1,5-dicyanonaphtaren (BSN).

For example, the green light-emitting layer may include one or more of a green light-emitting material, a hole transport material, an electron transport material, and a both charge transport material. The green light-emitting material may be a fluorescent material or a phosphorescent material. For example, the green light-emitting layer may have a thickness of about 10 nm, and may be formed of DPVBi mixed with 5 wt % of Coumarin 6.

For example, the blue light-emitting layer may include one or more of a blue light-emitting material, a hole transport material, an electron transport material, and a both charge transport material. The blue light-emitting material may be a fluorescent material or a phosphorescent material. For example, the blue light-emitting layer may have a thickness of about 30 nm, and may be formed of DPVBi mixed with 2.5 wt % of 4,4'-bis[2-{4-(N,N-diphenylamino)phenyl}vinyl]biphenyl (DPAVBi).

The electron transport layer is to increase the electron transport efficiency to the light-emitting layer 16, and for example, may be formed of 8-hydroxyquinorinaluminum (Alq3) with a thickness of about 20 nm. The electron injection layer is to increase the electron injection efficiency to the light-emitting layer 16, and for example, may be formed of LiF, $Li_2O$, or the like with a thickness of about 0.3 nm.

The second electrode 17 is paired with the first electrode 14 with the organic layer in between, and is provided on the electron injection layer so as to be insulated from the first electrode 14 and so as to be common to the organic EL devices 10. The second electrode 17 is formed of a light-transmissive transparent material, and may be formed of, for example, an alloy of aluminum (Al), magnesium (Mg), silver (Ag), calcium (Ca), or sodium (Na). Among them, an alloy of magnesium and silver (Mg-Ag alloy) is preferable because the alloy has a conductivity and small absorbability in a thin film state. Although the ratio of magnesium and silver in the Mg—Ag alloy is not particularly limited, the ratio is desirably within a range of Mg:Ag=20:1 to 1:1 in film thickness. Alternatively, as the material of the second electrode 17, an alloy of aluminum (Al) and lithium (Li) (Al—Li alloy) may be used, or indium tin oxide (ITO), zinc oxide (ZnO), alumina-doped zinc oxide (AZO), gallium-doped zinc oxide (GZO), indium zinc oxide (IZO), indium titanium oxide (ITiO), indium tungsten oxide (IWO), or the like may be used.

For example, the protective layer 18 may be formed of an insulating resin material such as polyimide, similarly to the planarization layer 13.

The counter substrate 21 seals the organic EL devices 10 together with an adhesive layer (not illustrated) such as a thermosetting resin. The counter substrate 21 is formed of a transparent glass material or a transparent plastic material that allows light generated in the light-emitting layer 16 to pass therethrough. A color filter (not illustrated) is provided on one surface of the counter substrate 21. The color filter includes a red filter, a green filter, and a blue filter that are arranged in order corresponding to the organic EL devices 10R, 10G, and 10B, respectively. Although the color filter may be provided on any of the surfaces of the counter substrate 21, is preferably provided on a surface on the organic EL devices 10 side. This is because the color filter is not exposed on the surface and is protected by the protective layer 18 (or the adhesive layer). In addition, this is because a distance between the light-emitting layer 16 and the color filter is decreased so as to prevent the light emitted from the light-emitting layer 16 from entering adjacent other color filter to cause color mixture.

Such a display unit 1 may be manufactured in the following way, for example (FIGS. 5A, 5B, 5C, 6A, 6B, 6C, 7A, 7B, 8A, 8B, 9A, 9B, 10, 11A, and 11B).

First, the pixel drive circuit 150 (the TFT layer 12) including the drive transistor Tr1 is formed on the support substrate 11 made of the above-described material, and for example, a photosensitive resin is then applied on the entire surface of the support substrate 11. The photosensitive resin is subjected to exposure and development to be patterned into a predetermined shape, and thus the planarization layer 13 is formed. At the same time as the patterning, the contact hole 13H and the plug are formed (FIG. 5A).

Subsequently, as illustrated in FIG. 5B, a metal film 14AM made of titanium with a thickness of about 2 nm or more, and a metal film 14BM made of aluminum with a thickness of about 20 nm or more are formed by, for example, sputtering in order on the planarization layer 13. Then, a resist 22 is applied on the metal film 14BM (FIG. 5C), and the metal film 14M (the metal films 14AM and 14BM) is patterned using photolithography. Specifically, after the resist 22 is exposed, dry etching is performed (FIG. 6A), and the resist 22 is removed by ashing and washing to form the first electrode 14 divided for each organic EL device 10 (FIG. 6B).

Subsequently, as illustrated in FIG. 6C, an insulating film 19M made of, for example, silicon oxide is formed to have a thickness of, for example, 20 nm or more on the entire surface of the support substrate 11. At this time, the insulating film 19M is formed to be larger in thickness than the first electrode 14. The insulating film 19M is formed using, for example, plasma chemical vapor deposition (CVD) that is capable of forming a conformal film. High density plasma (HPD) may be used to fill a gap (to prevent formation of pore) between the first electrodes 14. After the insulating film 19M is formed, the barrier 19 is formed by photolithography and etching. Specifically, first, a resist 23 is applied on the insulating film 19M, and is then exposed (FIG. 7A). Then, etching is performed to form an opening on the insulating film 19M (FIG. 7B), and the resist 23 is removed by ashing and washing (FIG. 8A). As a result, the barrier 19 is formed.

Then, as illustrated in FIG. 8B, the hole injection layer 15 is formed by, for example, an evaporation method on the entire surface of the support substrate 11, and the hole injection layer 15 covering from the first electrode 14 to the barrier 19 in the inter-electrode region is provided. After that, en energy ray E having directivity is applied to the hole injection layer 15 (FIG. 9A) to form the disconnecting section 15D (FIG. 9B). For example, an ion beam, an atomic beam, a molecular beam, an electron beam, a laser beam, and the like may be used as the energy ray E. For example, by performing ion-milling using an argon (Ar) ion beam as the energy ray E, the hole injection layer 15 in the inter-electrode region is removed, and thus the disconnecting section 15D is formed. The energy ray E is applied to the surface of the first electrode 14 at a low angle of, for example, 1 degree or more and less than 90 degrees. The barrier 19 is raised compared with the surface of the first electrode 14. Therefore, the energy ray E applied at a low angle is blocked by the barrier 19, and the hole injection layer 15 on the first electrode 14 is prevented from being removed. As described above, the energy ray E is locally applied to the hole injection layer 15 in the inter-electrode region with use of the shape of the barrier 19 so that the disconnecting section 15D is allowed to be formed by self-alignment without using a mask or the like. In this case, only the hole injection layer 15 is selectively removed by the application of the energy ray E. The hole injection layer 15 is extremely smaller in thickness than the barrier 19 or the like in the lower layer, and thus provision of the disconnecting section 15D does not affects the light-emitting layer 16, the second electrode 17, and the like in the upper layer.

As illustrated in FIG. 10, after the barrier 19 and the hole injection layer 15 are formed without patterning the metal film 14M, the energy ray E may be applied. By application of the energy ray E, the disconnecting section 15D of the hole injection layer 15 and the metal film 14M in a lower layer of the barrier 19 are removed to form a gap. In other words, the gap between the first electrodes 14 adjacent to each other is formed.

After the disconnecting section 15D is provided in the hole injection layer 15, as illustrated in FIG. 11A, the hole transport layer (not illustrated), the light-emitting layer 16, the electron transport layer (not illustrated), the electron injection layer (not illustrated), and the second electrode 17 are formed by, for example, an evaporation method in this order on the entire surface of the support substrate 11. As a result, the organic EL device 10 is formed.

Subsequently, the protective layer 18 is formed by, for example, CVD or sputtering on the organic EL device 10 (FIG. 11B). Finally, the counter substrate 21 provided with the color filter is bonded to the protective layer 18 with the adhesive layer (not illustrated) in between to complete the display unit 1.

In the display unit 1, the scan signal is supplied from the scan line drive circuit 130 to each of the organic EL devices 10 (10R, 10G, and 10B) through the gate electrode of the write transistor Tr2, and the picture signal is supplied from the signal line drive circuit 120 through the write transistor Tr2 and is retained in the retention capacitance Cs. Specifically, the drive transistor Tr1 is controlled to be turned on or off in response to the signal retained in the retention capacitance Cs, and thus a drive current Id is injected to each of the organic EL devices 10. This causes recombination of holes and electrons, thereby resulting in light emission. The light is extracted after passing through the second electrode 17, the color filter (not illustrated), and the counter substrate 21.

In this case, since the disconnecting section 15D of the hole injection layer 15 is provided in the inter-electrode region by application of the energy ray E, occurrence of a leakage current through the hole injection layer 15 is allowed to be prevented.

FIG. 12 illustrates a sectional structure of a display unit (a display unit 100) according to a comparative example. In the display unit 100, a disconnecting section is not provided in a hole injection layer 151, and the hole injection layers 151 in respective organic EL devices 100E are connected to one another. Accordingly, a drive current flows between the organic EL devices 100E through the hole injection layer 151, which may result in occurrence of leakage. In particular, in a white emission type display, the organic layer is not colored individually for each organic EL device, and thus occurrence of leakage easily becomes an issue.

In Patent Literature 1, a method of increasing resistance of a hole injection layer between devices by a barrier provided in an inverted-tapered shape to prevent occurrence of leakage is proposed. However, it is difficult to increase the resistance sufficiently by the method. In addition, the barrier is deformed into a tapered shape by thermal treatment after the formation of the hole injection layer, and thus an organic layer such as the hole injection layer may be deteriorated by heat.

In contrast, in the display unit 1, since the disconnecting section 150 of the hole injection layer 15 is formed by application of the energy ray E, flow of the current through the hole injection layer 15 is blocked by the inter-electrode region. Accordingly, occurrence of leakage through the hole injection layer 15 is allowed to be suppressed more surely. Moreover, appropriately selecting the energy ray E prevents characteristic deterioration of the organic EL device 10. For example, heat is not generated by application of an ion beam, and thus the characteristics of the organic EL device 10 are maintained without deterioration. Further, the energy ray E is locally applied to the hole injection layer 15 in the inter-electrode region with use of the shape of the barrier 19, and thus the disconnecting section 15D is allowed to be formed by self alignment without using a mask or the like.

As described above, in the display unit 1 of the first embodiment, since the disconnecting section 15D of the hole injection layer 15 is provided in the inter-electrode region by application of the energy ray E, occurrence of leakage through the hole injection layer 15 is allowed to be prevented more surely.

Hereinafter, modifications of the first embodiment and other embodiments will be described, and like numerals are used to designate substantially like components of the first embodiment, and the description thereof will be appropriately omitted.

Modification 1

FIG. 13 illustrates a sectional structure of a display unit (a display unit 1A) according to a modification 1. The display unit 1A has a high-resistance section 15H of the hole injection layer 15 in the inter-electrode region. Except for this point, the display unit 1A has a structure, function, and effects similar to those of the display unit 1.

As illustrated in FIG. 14A, the high-resistance section 15H of the hole injection layer 15 is a section to which the energy ray E has been applied similarly to the first embodiment. In the high-resistance section 15H, the hole injection layer 15 is not removed, and the material thereof is modified by application of the energy ray E to have the high resistance (FIG. 14B). Accordingly, occurrence of a leakage current through the hole injection layer 15 is allowed to be prevented, similarly to the disconnecting section 15D.

Modification 2

FIG. 15 illustrates a sectional structure of a display unit (a display unit 1B) according to a modification 2. In the display unit 1B, a picture is displayed on the support substrate 11 side. In other words, the display unit 1B is a so-called bottom-emission type display unit. Except for this point, the display unit 1B has a structure, function, and effects similar to those of the display unit 1.

In the display unit 1 B, the support substrate 11 and the first electrode 14 are each formed of a transparent material, and the second electrode 17 is formed of a reflective material. Light emitted from the light-emitting layer 16 is extracted after passing through the first electrode 14 and the support substrate 11. The high-resistance section 15H may be provided in place of the disconnecting section 15D (FIG. 13).

Second Embodiment

FIG. 16 illustrates a sectional structure of a display unit (a display unit 2) according to a second embodiment. In the display unit 2, by application of the energy ray E, the hole injection layer 15 is removed and a part of the barrier 19 is shaved. Except for this point, the display unit 2 has a structure, function, and effects similar to those of the display unit 1.

As illustrated in FIG. 17, when the energy ray E is applied to the hole injection layer 15, selection of the kind of the energy ray E allows etching of the surface of the barrier 19. For example, when an argon ion beam is applied to the barrier 19 formed of silicon oxide, the barrier 19 is etched. The etched barrier 19 is smoothed compared with the time of formation, and a step between the barrier 19 and the first electrode 14 is decreased. In such a way, smoothing the barrier 19 prevents disconnection of the second electrode 17 on the barrier 19.

As illustrated in FIGS. 18A and 18B, the energy ray E may be applied to the barrier 19 having a projection 19P. Providing the projection 19P allows control of etching of the barrier 19 by application of the energy ray E. The size and the shape of the projection 19P may be appropriately adjusted, and the cross-sectional surface of the projection 19P may be, for example, a square shape (FIG. 18A) or a triangular shape (FIG. 18B).

Third Embodiment

FIG. 19 illustrates a sectional structure of a display unit (a display unit 3) according to a third embodiment. In the display unit 3, the disconnecting section 15D of the hole injection layer 15 and a disconnecting section (a disconnecting section 16D) of the light-emitting layer 16 are provided in the inter-electrode region. Except for this point, the display unit 3 has a structure, function, and effects similar to those of the display unit 1.

The disconnecting section 16D of the light-emitting layer 16 is a section in which the light-emitting layer 16 is removed by application of the energy ray E. When the light-emitting layer 16 on the barrier 19 (in the inter-electrode region) is removed, a step formed in the second electrode 17 between the organic EL devices 10 is decreased, and thus disconnection of the second electrode 17 is allowed to be prevented. Moreover, providing the disconnecting section 16D in addition to the disconnecting section 15D more effectively prevents occurrence of a leakage current.

For example, as illustrated in FIG. 20A, the disconnecting section 16D of the light-emitting layer 16 may be formed together with the disconnecting section 15D of the hole injection layer 15 by application of the energy ray E (FIG. 20B) after the hole injection layer 15 and the light-emitting layer 16 are successively formed.

Alternatively, as illustrated in FIG. 21A, after the disconnecting section 15D is formed in the hole injection layer 15, the light-emitting layer 16 is formed, and then the disconnecting section 16D of the light-emitting layer 16 may be formed by application of the energy ray E again (FIG. 21B).

Fourth Embodiment

FIG. 22 illustrates a sectional structure of a display unit (a display unit 4) according to a fourth embodiment. In the display unit 4, the disconnecting section 16D is provided in the light-emitting layer 16 similarly to the above-described display unit 3. In addition, a terminal (a terminal 17T) electrically connected to the second electrode 17 is embedded in the barrier 19. Except for this point, the display unit 4 has a structure, function, and effects similar to those of the display unit 1.

The terminal 17T may be formed of, for example, tungsten, titanium, aluminum, or titanium nitride (TiN), and is embedded in the barrier 19 so that the surface thereof is exposed. The surface of the terminal 17T is in contact with the second electrode 17, and the terminal 17T is electrically connected to the second electrode 17. For example, the terminal 17T may be connected to the common power supply line (GND) (FIG. 3).

In the display unit 100 according to the comparative example, the second electrode 17 is provided in a region wider than the display region 110, and is electrically connected to an electrode pad 117T that is arranged so as to surround the display region 110 (FIGS. 23A and 23B). In the display unit 100, it is necessary to provide such an electrode pad 117T outside of the display region 110, and a region (a peripheral region) between the display region 110 and a dicing region 111 is accordingly increased. In addition, a mask is used to form the electrode pad 117T, and therefore it is necessary to provide an area for margin between the display region 110 and the electrode pad 117T. For example, a bonding pad 118 may be provided outside of the electrode pad 117T.

In the display unit 4, in place of the above-described electrode pad 117T, the terminal 17T is provided so that the peripheral region is allowed to be decreased. In addition, the disconnecting section 16D of the light-emitting layer 16 prevents disconnection of the second electrode 17. Although it is sufficient to provide the disconnecting section 16D so that the second electrode 17 and the terminal 17T are in contact with each other (FIG. 22), the disconnecting section 16D may be provided over a wider region (FIG. 19). FIGS. 24A, 24B, 24C, 25A, 25B, and 25C illustrate a method of manufacturing the display unit 4.

First, as described for the display unit 1, after the first electrode 14 is formed, the terminal 17T is formed in the inter-electrode region. Next, the barrier 19 is formed so that the terminal 17T is embedded therein and is totally covered therewith (FIG. 24A). Subsequently, the hole injection layer 15 is formed over the entire surface of the support substrate 11 (FIG. 24B), and the energy ray E is then applied to form the disconnecting section 15D of the hole injection layer 15 (FIG. 24C). After the disconnecting section 15D is formed, the light-emitting layer 16 is formed over the entire surface of the substrate 11 (FIG. 25A), and the energy ray E is applied thereto again. As a result, the disconnecting section 16D is formed in the light-emitting layer 16, and the barrier 19 is shaved so that the surface of the terminal 17T is exposed (FIG. 25B). After that, the second electrode 17 is formed to be electrically connect with the terminal 17T (FIG. 25C). When the barrier 19 is shaved and smoothed in addition to providing the disconnecting section 16D in the light-emitting layer 16, the disconnection of the second electrode 17 is more surely prevented. Hereinafter, as with the display unit 1, the protective layer 18 and the counter substrate 21 are provided to complete the display unit 4.

Module

Any of the display units 1, 1A, 1B, 2, 3, and 4 of the above-described embodiments and the modifications may be incorporated in various kinds of electronic apparatuses such as application examples 1 to 5 described below as a module illustrated in FIG. 26, for example. In particular, it is suitable for a microdisplay demanded to have high definition, such as a view finder of a video camcorder or a single-lens reflex camera, and a head-mount display. For example, the module may have a region 210 exposed from the counter substrate 21 on a side of the support substrate 11, and may have an external connection terminal (not illustrated) that is formed of an extended wire of the signal line drive circuit 120 and an extended wire of the scan line drive circuit 130 in the exposed region 210. The external connection terminal may be provided with a flexible printed circuit (FPC) 220 for inputting and outputting signals.

Application Example 1

FIG. 27 illustrates an appearance of a television to which the display unit of any of the embodiments and the modifications is applied. The television may have, for example, a picture display screen section 300 including a front panel 310 and a filter glass 320, and the picture display screen section 300 is configured of the display unit according to any of the embodiments and the modifications.

Application Example 2

FIGS. 28A and 28B each illustrate an appearance of a digital camera to which the display unit of any of the embodiments and the modifications is applied. The digital camera may have, for example, a light-emitting section 410 for a flash, a display section 420, a menu switch 430, and a shutter button 440, and the display section 420 is configured of the display unit according to any of the embodiments and the modifications.

Application Example 3

FIG. 29 illustrates an appearance of a notebook personal computer to which the display unit of any of the embodiments and the modifications is applied. The notebook personal computer may have, for example, a main body 510, a keyboard 520 for input operation of characters and the like, and a display section 530 displaying a picture, and the display section 530 is configured of the display unit according to any of the embodiments and the modifications.

Application Example 4

FIG. 30 illustrates an appearance of a video camcorder to which the display unit of any of the embodiments and the modifications is applied. The video camcorder may have, for example, a main body section 610, a lens 620 that is used for shooting a subject and is provided on a front side surface of the main body section 610, a start-stop switch 630 for shooting, and a display section 640, and the display section 640 is configured of the display unit according to any of the embodiments and the modifications.

Application Example 5

FIGS. 31A and 31B each illustrates an appearance of a mobile phone to which the display unit of any of the embodiments and the modifications is applied. The mobile phone may be configured of, for example, an upper housing 710 and a lower housing 720 that are connected by a connection section (a hinge section) 730, and may have a display 740, a sub-display 750, a picture light 760, and a camera 770. The display 740 or the sub-display 750 is configured of the display unit according to any of the embodiments and the modifications.

Hereinbefore, although the technology has been described with reference to the embodiments and the modifications, the technology is not limited to the above-described embodiments and the like, and various modifications may be made. For example, the material, the thickness, the formation method, the formation condition, and the like of each layer are not limited to those described in the above-described embodiments and the like, and each layer may be formed of any other material with any other thickness by any other formation method under any other formation condition.

Moreover, in the above-described embodiments and the like, the case where, as the light-emitting layer 16, the light-emitting layer for emitting white light including three layers of the red light-emitting layer, the green light-emitting layer, and the blue light-emitting layer has been described. However, the configuration of the light-emitting layer 16 for emitting white light is not particularly limited, and may be configured by stacking light-emitting layers of two colors that are in complementary color relationship to each other, for example, an orange light-emitting layer and a blue light-emitting layer, or a blue-green light-emitting layer and a red light-emitting layer. Further, the light-emitting layer 16 is not limited to the light-emitting layer for emitting white light, and is applicable to a display unit for a single color in which, for example, only a green light-emitting layer is formed. In addition, the light-emitting layer 16 may be applied to a display unit in which the light-emitting layer 16 is colored individually for each organic EL device 10.

Furthermore, for example, in the above-described embodiments and the like, the case where the first electrode 14 serves as an anode and the second electrode 17 serves as a cathode has been described. Alternatively, the anode and the cathode may be inverted, and the first electrode 14 may serve as a cathode and the second electrode 17 may serve as an anode. In addition, the display units 3 and 4 may be a bottom-emission display unit.

Note that the technology may be configured as follows.

(1) A method of manufacturing a display unit, the method including:
  forming a plurality of first electrodes;
  forming a functional layer that covers from the first electrode to an inter-electrode region; and
  locally applying an energy ray to the functional layer to form a disconnecting section or a high-resistance section in the functional layer in the inter-electrode region.

(2) The method according to (1), wherein
  a barrier is provided in the inter-electrode region, and
  the energy ray is applied to the functional layer covering the barrier.

(3) The method according to (1) or (2), wherein the energy ray is applied to a surface of the first electrode at an angle of less than about 90 degrees.

(4) The method according to (2) or (3), wherein the functional layer is a hole injection layer between the first electrode and an light-emitting layer.

(5) The method according to (2) or (3), wherein the functional layer is a light-emitting layer and a hole injection layer between the light-emitting layer and the first electrode.

(6) The method according to any one of (2) to (5), wherein a second electrode that is paired with the first electrode is formed with the functional layer in between after the disconnecting section or the high-resistance section is provided in the functional layer.

(7) The method according to (6), wherein the energy ray is applied to form the disconnecting section and to allow a surface of a terminal embedded in the barrier to be exposed, and
  the terminal is electrically connected to the second electrode.

(8) The method according to any one of (2) to (5), wherein
  the energy ray is applied to form the disconnecting section and to shave the barrier, and
  a second electrode that is paired with the first electrode is formed with the functional layer therebetween.

(9) The method according to any one of (1) to (8), wherein the energy ray is applied to form a gap between the first electrodes adjacent to each other.

(10) The method according to any one of (1) to (9), wherein one of an ion beam, an atomic beam, a molecular beam, an electron beam, and a laser beam is used as the energy ray.

(11) A method of manufacturing an electronic apparatus, the method including manufacturing a display unit, the manufacturing the display unit including:
  forming a plurality of first electrodes;
  forming a functional layer that covers from the first electrode to an inter-electrode region; and
  locally applying an energy ray to the functional layer to form a disconnecting section or a high-resistance section in the functional layer in the inter-electrode region.

(12) A display unit including:
  a plurality of first electrodes; and
  a functional layer covering from the first electrode to an inter-electrode region, and having a disconnecting section or a high-resistance section in the inter-electrode region, the disconnecting section or the high-resistance section being formed by local application of an energy ray.

(13) The display unit according to (12), further including:
  a barrier provided in the inter-electrode region;
  a second electrode facing the first electrode with the functional layer in between; and
  a terminal embedded in the barrier and electrically connected to the second electrode.

It should be understood by those skilled in the art that various modifications, combinations, sub-combinations, and alternations may occur depending on design requirements and other factors insofar as they are within the scope of the appended claims or the equivalents thereof.

REFERENCE SIGNS LIST

1, 1A, 1 B, 2, 3, 4 . . . display unit, 10, 10R, 10G, 10B . . . organic EL device, L1 . . . pixel drive circuit forming layer, L2 . . . light-emitting device forming layer, 11 . . . support substrate, 12 . . . TFT layer, 13 . . . planarization layer, 13H . . . connection hole, 14, 14A, 14B . . . first electrode, 15 . . . hole injection layer, 15D, 16D . . . disconnecting section, 16 . . . light-emitting layer, 17 . . . second electrode, 17T . . . terminal, 18 . . . protective layer, 19 . . . barrier, 21 . . . counter substrate

The invention claimed is:

1. A display device, comprising:
a plurality of pixels, wherein
each of the plurality of pixels includes a first electrode, an organic layer, and a second electrode laminated in this order,
the organic layer includes a hole injection layer and a light emitting layer different from the hole injection layer, wherein the hole injection layer is in contact with the light emitting layer;
a plurality of barriers between the plurality of pixels, wherein
each of the plurality of barriers includes:
a terminal that is electrically connected with the second electrode, wherein a first surface of the terminal is in contact with the second electrode,
a first portion that covers an edge of the first electrode of both adjacent pixels of the plurality of pixels, wherein
the both adjacent pixels correspond to the each of the plurality of barriers, and
the hole injection layer is in contact with the first portion, and
a second portion between the first electrodes of the both adjacent pixels in plain view of the display device, wherein
the second portion is on the first portion, and
a cross-sectional surface of the second portion has a forward tapered shape;
a substrate; and
a planarization layer on the substrate, wherein
a second surface of the terminal is inside the planarization layer,
the first surface is opposite to the second surface, and
only the terminal is inside the planarization layer.

2. The display device according to claim 1, wherein the organic layer further includes an electron injection layer.

3. The display device according to claim 2, wherein the first portion and the second portion include same insulating material.

4. The display device according to claim 3, wherein each of the first portion and the second portion includes one of silicon oxide, silicon nitride, or silicon oxynitride.

5. The display device according to claim 3, wherein the hole injection layer has a disconnecting section at an edge of the first portion.

6. The display device according to claim 3, wherein the hole injection layer has a disconnecting section on the second portion.

7. The display device according to claim 2, wherein the first electrode has a stacked structure of at least two layers.

8. The display device according to claim 7, wherein the first electrode includes one of silver (Ag) or indium tin oxide (ITO).

9. The display device according to claim 2, wherein a slope of a side surface of the first portion in the plain view is different from a slope of a side surface of the second portion in the plain view.

10. An electronic apparatus, comprising:
a display device including:
a plurality of pixels, wherein
each of the plurality of pixels includes a first electrode, an organic layer, and a second electrode laminated in this order,
the organic layer includes a hole injection layer and a light emitting layer different from the hole injection layer, wherein the hole injection layer is in contact with the light emitting layer;
a plurality of barriers between the plurality of pixels, wherein
each of the plurality of barriers includes:
a terminal that is electrically connected with the second electrode, wherein a first surface of the terminal is in contact with the second electrode,
a first portion that covers an edge of the first electrode of both adjacent pixels of the plurality of pixels, wherein
the both adjacent pixels correspond to the each of the plurality of barriers, and
the hole injection layer is in contact with the first portion, and
a second portion between the first electrodes of the both adjacent pixels in plain view of the display device, wherein
the second portion is on the first portion, and
a cross-sectional surface of the second portion has a forward tapered shape;
a substrate; and
a planarization layer on the substrate, wherein
a second surface of the terminal is inside the planarization layer,
the first surface is opposite to the second surface, and
only the terminal is inside the planarization layer.

11. The display device according to claim 1, wherein the forward tapered shape is a triangular shape.

* * * * *